United States Patent
Tasic et al.

(10) Patent No.: US 9,154,356 B2
(45) Date of Patent: Oct. 6, 2015

(54) LOW NOISE AMPLIFIERS FOR CARRIER AGGREGATION

(75) Inventors: Aleksandar Miodrag Tasic, San Diego, CA (US); Anosh Bomi Davierwalla, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/590,423

(22) Filed: Aug. 21, 2012

(65) Prior Publication Data
US 2013/0315348 A1 Nov. 28, 2013

Related U.S. Application Data

(60) Provisional application No. 61/652,064, filed on May 25, 2012.

(51) Int. Cl.
| | |
|---|---|
| *H04L 27/06* | (2006.01) |
| *H04L 27/26* | (2006.01) |
| *H03G 3/20* | (2006.01) |
| *H03F 1/22* | (2006.01) |
| *H03F 3/193* | (2006.01) |

(Continued)

(52) U.S. Cl.
CPC ............ *H04L 27/2647* (2013.01); *H03F 1/223* (2013.01); *H03F 3/193* (2013.01); *H03F 3/68* (2013.01); *H03F 3/72* (2013.01); *H03G 3/20* (2013.01)

(58) Field of Classification Search
CPC . H04L 27/2647; H04L 27/2649; H04L 27/38; H03H 7/40; H03G 3/20
USPC ................. 375/316, 317, 318, 345, 349, 340; 455/130, 132, 136, 234.1; 370/542
See application file for complete search history.

(56) References Cited

U.S. PATENT DOCUMENTS

| | | |
|---|---|---|
| 3,911,364 A | 10/1975 | Langseth et al. |
| 4,035,728 A | 7/1977 | Ishikawa et al. |

(Continued)

FOREIGN PATENT DOCUMENTS

| | | |
|---|---|---|
| CN | 1523912 A | 8/2004 |
| CN | 1922795 A | 2/2007 |

(Continued)

OTHER PUBLICATIONS

International Search Report and Written Opinion—PCT/US2013/042726—ISA/EPO—Oct. 2, 2013.

(Continued)

*Primary Examiner* — Khanh C Tran
(74) *Attorney, Agent, or Firm* — Ramin Mobarhan

(57) ABSTRACT

Low noise amplifiers (LNAs) supporting carrier aggregation are disclosed. In an exemplary design, an apparatus includes first and second amplifier stages, e.g., for a carrier aggregation (CA) LNA or a multiple-input multiple-output (MIMO) LNA. The first amplifier stage receives and amplifies an input radio frequency (RF) signal and provides a first output RF signal to a first load circuit when the first amplifier stage is enabled. The input RF signal includes transmissions sent on multiple carriers at different frequencies to a wireless device. The second amplifier stage receives and amplifies the input RF signal and provides a second output RF signal to a second load circuit when the second amplifier stage is enabled. Each amplifier stage may include a gain transistor coupled to a cascode transistor.

20 Claims, 17 Drawing Sheets

(51) Int. Cl.
  *H03F 3/68* (2006.01)
  *H03F 3/72* (2006.01)

(56) References Cited

U.S. PATENT DOCUMENTS

| | | | |
|---|---|---|---|
| 4,035,729 A | 7/1977 | Perry | |
| 4,246,655 A | 1/1981 | Parker | |
| 4,326,294 A | 4/1982 | Okamoto et al. | |
| 4,715,048 A | 12/1987 | Masamura | |
| 4,742,563 A | 5/1988 | Fukumura | |
| 4,756,023 A | 7/1988 | Kojima | |
| 4,969,207 A | 11/1990 | Sakamoto et al. | |
| 5,056,411 A | 10/1991 | Baker | |
| 5,128,630 A | 7/1992 | Mijuskovic | |
| 5,291,519 A | 3/1994 | Tsurumaru | |
| 5,321,850 A | 6/1994 | Backstrom et al. | |
| 5,345,601 A | 9/1994 | Takagi et al. | |
| 5,390,342 A | 2/1995 | Takayama et al. | |
| 5,559,838 A | 9/1996 | Nakagoshi | |
| 5,566,364 A | 10/1996 | Mizoguchi et al. | |
| 5,694,396 A | 12/1997 | Firouzbakht et al. | |
| 5,697,083 A | 12/1997 | Sano | |
| 5,761,613 A | 6/1998 | Saunders et al. | |
| 5,794,159 A | 8/1998 | Portin | |
| 5,805,643 A | 9/1998 | Seki et al. | |
| 5,805,989 A | 9/1998 | Ushida | |
| 5,835,853 A | 11/1998 | Enoki et al. | |
| 5,940,452 A | 8/1999 | Rich | |
| 5,999,815 A | 12/1999 | TenBrook et al. | |
| 5,999,990 A | 12/1999 | Sharrit et al. | |
| 6,026,288 A | 2/2000 | Bronner | |
| 6,040,732 A | 3/2000 | Brokaw | |
| 6,044,254 A | 3/2000 | Ohta et al. | |
| 6,063,961 A | 5/2000 | Kroner | |
| 6,069,923 A | 5/2000 | Ostman et al. | |
| 6,088,348 A | 7/2000 | Bell, III | |
| 6,208,844 B1 | 3/2001 | Abdelgany | |
| 6,249,687 B1* | 6/2001 | Thomsen et al. | 455/553.1 |
| 6,407,689 B1 | 6/2002 | Bazarjani et al. | |
| 6,424,683 B1 | 7/2002 | Schoellhorn | |
| 6,430,237 B1 | 8/2002 | Anvari | |
| 6,472,947 B1 | 10/2002 | Zeitz | |
| 6,473,601 B1 | 10/2002 | Oda | |
| 6,522,895 B1 | 2/2003 | Montalvo | |
| 6,535,725 B2 | 3/2003 | Hatcher et al. | |
| 6,600,759 B1 | 7/2003 | Wood | |
| 6,600,907 B1 | 7/2003 | Taguchi | |
| 6,600,931 B2 | 7/2003 | Sutton et al. | |
| 6,657,498 B2 | 12/2003 | Park et al. | |
| 6,806,777 B2 | 10/2004 | Franca-Neto | |
| 6,819,941 B2 | 11/2004 | Dening et al. | |
| 6,888,888 B1 | 5/2005 | Tu et al. | |
| 6,952,594 B2 | 10/2005 | Hendin | |
| 6,954,446 B2 | 10/2005 | Kuffner | |
| 6,983,132 B2 | 1/2006 | Woo et al. | |
| 6,985,712 B2 | 1/2006 | Yamakawa et al. | |
| 6,987,950 B2 | 1/2006 | Coan | |
| 7,013,166 B2 | 3/2006 | Clifford | |
| 7,024,172 B1 | 4/2006 | Murphy et al. | |
| 7,039,377 B2* | 5/2006 | Yates | 455/232.1 |
| 7,123,891 B2 | 10/2006 | Loke | |
| 7,142,042 B1 | 11/2006 | Henry | |
| 7,161,423 B2 | 1/2007 | Paul et al. | |
| 7,167,044 B2 | 1/2007 | Li et al. | |
| 7,187,239 B2 | 3/2007 | Yeh | |
| 7,187,735 B2 | 3/2007 | Kent, III | |
| 7,187,904 B2 | 3/2007 | Gainey et al. | |
| 7,212,788 B2 | 5/2007 | Weber et al. | |
| 7,224,231 B2 | 5/2007 | Wu | |
| 7,260,377 B2 | 8/2007 | Burns et al. | |
| 7,283,851 B2 | 10/2007 | Persico et al. | |
| 7,299,021 B2 | 11/2007 | Parssinen et al. | |
| 7,313,368 B2 | 12/2007 | Wu et al. | |
| 7,317,894 B2* | 1/2008 | Hirose | 455/3.02 |
| 7,333,831 B2 | 2/2008 | Srinivasan et al. | |
| 7,356,325 B2 | 4/2008 | Behzad et al. | |
| 7,403,508 B1 | 7/2008 | Miao | |
| 7,444,166 B2 | 10/2008 | Sahota et al. | |
| 7,454,181 B2 | 11/2008 | Banister et al. | |
| 7,477,106 B2 | 1/2009 | Van Bezooijen et al. | |
| 7,570,111 B1 | 8/2009 | Vagher et al. | |
| 7,599,675 B2 | 10/2009 | Mu et al. | |
| 7,643,847 B2 | 1/2010 | Daanen et al. | |
| 7,643,848 B2 | 1/2010 | Robinett et al. | |
| 7,697,905 B2 | 4/2010 | Lee et al. | |
| 7,728,664 B2 | 6/2010 | Chang et al. | |
| 7,751,513 B2* | 7/2010 | Eisenhut et al. | 375/349 |
| 7,764,726 B2 | 7/2010 | Simic et al. | |
| 7,848,724 B2 | 12/2010 | Bult et al. | |
| 7,869,528 B2 | 1/2011 | Robinson | |
| 7,877,075 B1 | 1/2011 | Jin et al. | |
| 7,911,269 B2 | 3/2011 | Yang et al. | |
| 7,944,298 B2 | 5/2011 | Cabanillas et al. | |
| 7,949,309 B2 | 5/2011 | Rofougaran et al. | |
| 7,952,398 B2 | 5/2011 | Salcido et al. | |
| 8,022,772 B2 | 9/2011 | Cassia et al. | |
| 8,055,229 B2 | 11/2011 | Huang | |
| 8,063,706 B2 | 11/2011 | Li et al. | |
| 8,081,672 B2 | 12/2011 | Kent et al. | |
| 8,090,332 B2 | 1/2012 | Sahota et al. | |
| 8,090,369 B2 | 1/2012 | Kitazoe | |
| 8,139,670 B1 | 3/2012 | Son et al. | |
| 8,149,955 B2 | 4/2012 | Tired | |
| 8,195,117 B2 | 6/2012 | Bult et al. | |
| 8,208,887 B2 | 6/2012 | Lee et al. | |
| 8,217,723 B2 | 7/2012 | Rajendran et al. | |
| 8,242,841 B2 | 8/2012 | Zhang | |
| 8,270,927 B2 | 9/2012 | Wallace et al. | |
| 8,290,449 B2 | 10/2012 | Keehr et al. | |
| 8,295,778 B2 | 10/2012 | Kotecha et al. | |
| 8,306,494 B2 | 11/2012 | Ojo | |
| 8,442,473 B1* | 5/2013 | Kaukovuori et al. | 455/323 |
| 8,514,015 B2* | 8/2013 | Chen | 330/51 |
| 8,600,315 B2 | 12/2013 | Roufoogaran et al. | |
| 8,626,084 B2 | 1/2014 | Chan et al. | |
| 8,676,148 B2 | 3/2014 | Ogasawara | |
| 8,706,069 B2 | 4/2014 | Khoini-Poorfard et al. | |
| 2002/0008575 A1* | 1/2002 | Oskowsky et al. | 330/51 |
| 2002/0061773 A1 | 5/2002 | Adachi et al. | |
| 2002/0111163 A1 | 8/2002 | Hamabe | |
| 2002/0132597 A1 | 9/2002 | Peterzell et al. | |
| 2002/0173337 A1 | 11/2002 | Hajimiri et al. | |
| 2002/0193108 A1 | 12/2002 | Robinett | |
| 2003/0076797 A1 | 4/2003 | Lozano | |
| 2003/0081694 A1 | 5/2003 | Wieck | |
| 2003/0125040 A1 | 7/2003 | Walton et al. | |
| 2003/0148750 A1 | 8/2003 | Yan et al. | |
| 2003/0157915 A1 | 8/2003 | Atkinson et al. | |
| 2003/0176176 A1 | 9/2003 | Leinonen et al. | |
| 2003/0203743 A1 | 10/2003 | Sugar et al. | |
| 2003/0206076 A1 | 11/2003 | Hashemi et al. | |
| 2003/0228851 A1 | 12/2003 | Taniguchi | |
| 2004/0087290 A1 | 5/2004 | Schmidt et al. | |
| 2004/0092243 A1 | 5/2004 | Hey-Shipton | |
| 2004/0113746 A1 | 6/2004 | Brindle | |
| 2004/0116086 A1 | 6/2004 | Huttunen | |
| 2004/0121753 A1 | 6/2004 | Sugar et al. | |
| 2004/0204104 A1 | 10/2004 | Horng et al. | |
| 2004/0219959 A1 | 11/2004 | Khayrallah et al. | |
| 2004/0224643 A1 | 11/2004 | Nakai | |
| 2004/0253955 A1 | 12/2004 | Love et al. | |
| 2004/0266356 A1 | 12/2004 | Javor et al. | |
| 2005/0039060 A1 | 2/2005 | Okayasu | |
| 2005/0075077 A1 | 4/2005 | Mach et al. | |
| 2005/0079847 A1 | 4/2005 | Arafa | |
| 2005/0118977 A1 | 6/2005 | Drogi et al. | |
| 2005/0197090 A1 | 9/2005 | Stockstad et al. | |
| 2005/0215264 A1 | 9/2005 | Subramaniam et al. | |
| 2005/0231290 A1 | 10/2005 | Hung et al. | |
| 2005/0265084 A1 | 12/2005 | Choi | |
| 2005/0277387 A1 | 12/2005 | Kojima et al. | |
| 2006/0009177 A1 | 1/2006 | Persico et al. | |
| 2006/0023745 A1 | 2/2006 | Koo et al. | |
| 2006/0061773 A1 | 3/2006 | Lee et al. | |

(56) References Cited

U.S. PATENT DOCUMENTS

| | | |
|---|---|---|
| 2006/0121937 A1 | 6/2006 | Son |
| 2006/0128322 A1 | 6/2006 | Igarashi et al. |
| 2006/0146693 A1 | 7/2006 | Mori et al. |
| 2006/0170503 A1 | 8/2006 | Lee et al. |
| 2006/0189286 A1 | 8/2006 | Kyu et al. |
| 2006/0222100 A1 | 10/2006 | Behzad |
| 2006/0234662 A1 | 10/2006 | Diloisy |
| 2006/0291428 A1 | 12/2006 | Filipovic |
| 2007/0049332 A1 | 3/2007 | Higuchi |
| 2007/0060080 A1 | 3/2007 | Nishimura et al. |
| 2007/0072577 A1 | 3/2007 | Rozenblit et al. |
| 2007/0105517 A1 | 5/2007 | Chang et al. |
| 2007/0142013 A1 | 6/2007 | Bucknor et al. |
| 2007/0177656 A1* | 8/2007 | Maruta et al. ............ 375/148 |
| 2007/0177693 A1 | 8/2007 | Kluge |
| 2007/0184801 A1 | 8/2007 | Kogawa et al. |
| 2007/0197170 A1 | 8/2007 | Boos |
| 2007/0197178 A1 | 8/2007 | Gu |
| 2007/0197204 A1 | 8/2007 | Herczog et al. |
| 2007/0202890 A1 | 8/2007 | Feher |
| 2007/0242784 A1 | 10/2007 | Sampson et al. |
| 2007/0243832 A1 | 10/2007 | Park et al. |
| 2007/0262817 A1 | 11/2007 | Ciccarelli et al. |
| 2007/0262871 A1 | 11/2007 | Yamagajo et al. |
| 2008/0004078 A1 | 1/2008 | Barratt et al. |
| 2008/0013654 A1 | 1/2008 | Rick et al. |
| 2008/0117999 A1 | 5/2008 | Kadous et al. |
| 2008/0139151 A1 | 6/2008 | Ojo et al. |
| 2008/0204148 A1 | 8/2008 | Kim et al. |
| 2008/0224770 A1 | 9/2008 | Kim et al. |
| 2008/0224791 A1 | 9/2008 | Cheng |
| 2008/0225971 A1 | 9/2008 | Behzad |
| 2008/0261650 A1 | 10/2008 | Piriyapoksombut et al. |
| 2008/0297259 A1 | 12/2008 | Mu |
| 2009/0124227 A1 | 5/2009 | Ishiguro |
| 2009/0227214 A1 | 9/2009 | Georgantas et al. |
| 2009/0237161 A1 | 9/2009 | Fagg |
| 2009/0243869 A1 | 10/2009 | Sanderford, Jr. |
| 2009/0253456 A1 | 10/2009 | Toh et al. |
| 2009/0290659 A1 | 11/2009 | Petrovic et al. |
| 2009/0323779 A1 | 12/2009 | Lennen |
| 2010/0019970 A1 | 1/2010 | Farrokhi et al. |
| 2010/0034094 A1 | 2/2010 | Tenny |
| 2010/0040178 A1 | 2/2010 | Sutton et al. |
| 2010/0041359 A1 | 2/2010 | Liu et al. |
| 2010/0142440 A1 | 6/2010 | Inoue |
| 2010/0195754 A1 | 8/2010 | Li et al. |
| 2010/0197263 A1 | 8/2010 | Dwyer et al. |
| 2010/0210226 A1 | 8/2010 | Matsuyama |
| 2010/0210272 A1 | 8/2010 | Sundstrom et al. |
| 2010/0210299 A1 | 8/2010 | Gorbachov |
| 2010/0214184 A1 | 8/2010 | Tran et al. |
| 2010/0225414 A1 | 9/2010 | Gorbachov |
| 2010/0226327 A1 | 9/2010 | Zhang et al. |
| 2010/0232493 A1 | 9/2010 | Thirumoorthy |
| 2010/0237947 A1 | 9/2010 | Xiong et al. |
| 2010/0253435 A1 | 10/2010 | Ichitsubo et al. |
| 2010/0265875 A1 | 10/2010 | Zhao et al. |
| 2010/0271986 A1 | 10/2010 | Chen |
| 2010/0272051 A1 | 10/2010 | Fu et al. |
| 2010/0301946 A1 | 12/2010 | Borremans |
| 2010/0311378 A1 | 12/2010 | Tasic et al. |
| 2010/0328155 A1 | 12/2010 | Simic et al. |
| 2010/0330977 A1 | 12/2010 | Kadous et al. |
| 2011/0018635 A1 | 1/2011 | Tasic et al. |
| 2011/0044380 A1 | 2/2011 | Marra et al. |
| 2011/0050319 A1 | 3/2011 | Wong |
| 2011/0084791 A1 | 4/2011 | Mun et al. |
| 2011/0086603 A1 | 4/2011 | Toosi et al. |
| 2011/0110463 A1 | 5/2011 | Chang et al. |
| 2011/0122972 A1 | 5/2011 | Lie et al. |
| 2011/0165848 A1 | 7/2011 | Gorbachov et al. |
| 2011/0193625 A1 | 8/2011 | Gatta et al. |
| 2011/0194504 A1 | 8/2011 | Gorokhov et al. |
| 2011/0204973 A1 | 8/2011 | Hu et al. |
| 2011/0211533 A1 | 9/2011 | Casaccia et al. |
| 2011/0217945 A1 | 9/2011 | Uehara et al. |
| 2011/0222443 A1 | 9/2011 | Khlat |
| 2011/0222444 A1 | 9/2011 | Khlat et al. |
| 2011/0242999 A1 | 10/2011 | Palanki et al. |
| 2011/0250926 A1 | 10/2011 | Wietfeldt et al. |
| 2011/0268048 A1 | 11/2011 | Toskala et al. |
| 2011/0268232 A1 | 11/2011 | Park et al. |
| 2011/0292844 A1 | 12/2011 | Kwun et al. |
| 2011/0299434 A1 | 12/2011 | Gudem et al. |
| 2011/0300810 A1 | 12/2011 | Mikhemar et al. |
| 2012/0009886 A1 | 1/2012 | Poulin |
| 2012/0013387 A1 | 1/2012 | Sankaranarayanan et al. |
| 2012/0026862 A1 | 2/2012 | Sadri et al. |
| 2012/0044927 A1 | 2/2012 | Pan et al. |
| 2012/0056681 A1 | 3/2012 | Lee |
| 2012/0057621 A1 | 3/2012 | Hong et al. |
| 2012/0195237 A1 | 8/2012 | Chan et al. |
| 2012/0236829 A1 | 9/2012 | Takano et al. |
| 2012/0293265 A1 | 11/2012 | Heikkinen et al. |
| 2012/0294299 A1 | 11/2012 | Fernando |
| 2012/0327825 A1 | 12/2012 | Gudem et al. |
| 2012/0329395 A1 | 12/2012 | Husted et al. |
| 2013/0003617 A1 | 1/2013 | Gudem et al. |
| 2013/0003783 A1 | 1/2013 | Gudem et al. |
| 2013/0043946 A1 | 2/2013 | Hadjichristos et al. |
| 2013/0051284 A1 | 2/2013 | Khlat |
| 2013/0114769 A1 | 5/2013 | Fernando |
| 2013/0163492 A1 | 6/2013 | Wong |
| 2013/0217398 A1 | 8/2013 | Winiecki et al. |
| 2013/0230080 A1 | 9/2013 | Gudem et al. |
| 2013/0231064 A1 | 9/2013 | Gudem et al. |
| 2013/0265892 A1 | 10/2013 | Fernando |
| 2013/0316668 A1 | 11/2013 | Davierwalla et al. |
| 2013/0316669 A1 | 11/2013 | Davierwalla et al. |
| 2013/0316670 A1 | 11/2013 | Tasic et al. |
| 2013/0329665 A1 | 12/2013 | Kadous et al. |
| 2014/0072001 A1 | 3/2014 | Chang et al. |
| 2014/0113578 A1 | 4/2014 | Xu |
| 2014/0269853 A1 | 9/2014 | Gudem et al. |

FOREIGN PATENT DOCUMENTS

| | | |
|---|---|---|
| CN | 101228702 A | 7/2008 |
| CN | 101242158 A | 8/2008 |
| CN | 101523967 A | 9/2009 |
| CN | 101789805 A | 7/2010 |
| EP | 1164719 A1 | 12/2001 |
| EP | 1370012 | 12/2003 |
| EP | 1398887 A1 | 3/2004 |
| EP | 1708372 A2 | 10/2006 |
| EP | 1726098 A1 | 11/2006 |
| EP | 1748567 A2 | 1/2007 |
| EP | 1761076 A2 | 3/2007 |
| EP | 2068583 A1 | 6/2009 |
| EP | 2141818 A1 | 1/2010 |
| EP | 1916767 B1 | 12/2010 |
| EP | 2393205 A2 | 12/2011 |
| EP | 2398285 A1 | 12/2011 |
| GB | 2472978 A | 3/2011 |
| JP | 05227234 | 9/1993 |
| JP | H0730452 A | 1/1995 |
| JP | 07221684 | 8/1995 |
| JP | 9027778 A | 1/1997 |
| JP | 09116458 | 5/1997 |
| JP | H11127300 A | 5/1999 |
| JP | 2000013278 A | 1/2000 |
| JP | 2001285114 A | 10/2001 |
| JP | 2002261880 A | 9/2002 |
| JP | 2004015162 A | 1/2004 |
| JP | 2006520143 A | 8/2006 |
| JP | 2007324711 A | 12/2007 |
| JP | 2008085793 A | 4/2008 |
| JP | 2008519535 A | 6/2008 |
| JP | 2009130867 A | 6/2009 |
| JP | 2011015112 A | 1/2011 |
| JP | 2011082669 A | 4/2011 |
| JP | 2011091747 A | 5/2011 |
| JP | 2011119807 A | 6/2011 |

(56) References Cited

FOREIGN PATENT DOCUMENTS

| | | |
|---|---|---|
| WO | 0150636 | 7/2001 |
| WO | 0237686 | 5/2002 |
| WO | 2005039060 | 4/2005 |
| WO | 2005062477 A2 | 7/2005 |
| WO | 2005088847 A1 | 9/2005 |
| WO | 2006050515 A2 | 5/2006 |
| WO | 2006118538 A2 | 11/2006 |
| WO | 2008059257 A1 | 5/2008 |
| WO | 2008084539 A1 | 7/2008 |
| WO | 2008092745 A1 | 8/2008 |
| WO | 2008103757 | 8/2008 |
| WO | 2008145604 A1 | 12/2008 |
| WO | 2010059257 A1 | 5/2010 |
| WO | 2011019850 A1 | 2/2011 |
| WO | 2011050729 A1 | 5/2011 |
| WO | 2011092005 A1 | 8/2011 |
| WO | 2011138697 A1 | 11/2011 |
| WO | 2012008705 A2 | 1/2012 |
| WO | 2012049529 A1 | 4/2012 |
| WO | 2013036794 A1 | 3/2013 |
| WO | 2013131047 | 9/2013 |

OTHER PUBLICATIONS

3GPP TS 36.101 V11.0.0, 3rd Generation Partnership Project; Technical Specification Group Radio Access Network; Evolved Universal Terrestrial Radio Access (E-UTRA); User Equipment (UE) radio transmission and reception (Release 11), Mar. 2012.

Aparin et al., "A Highly-integrated tri-band/quad-mode SiGe BiCMOS RF-to-baseband and receiver for wireless CDMA/WCDMA/AMPS applications with GPS capability", Solid-State Circuits Conference, 2002. Digest of Technical Papers. 2002 IEEE International Feb. 3-7, 2002, Piscataway, NJ, USA, IEEE, vol. 1, 2002, pp. 234-235, XP010585547, ISBN: 0-7803-7335-9.

Broyde F., et al., "The Noise Performance of aMultiple-Input-Port and Multiple-Output-Port Low-Noise Amplifier Connected to an Array of Coupled Antennas," International Journal of Antennas and Propagation, vol. 2011, Article ID 438478, Jul. 18, 2011, 12 pages.

Chen, et al, "A 5-6 GHz 1-V CMOS Direct-Conversion Receiver With an Integrated Quadrature Coupler," IEEE Journal of Solid-State Circuits, vol. 42, No. 9, 2007, pp. 1963-1975.

Chen, et al., "A monolithic 5.9-GHz CMOS I/Q direct-down converter utilizing a quadrature coupler and transformer-coupled subharmonic mixers," Microwave and Wireless Components Letters, IEEE , vol. 16, No. 4, 2006, pp. 197-199.

Garuda, et al., "A Multi-band CMOS RF Front-end for 4G WiMAX and WLAN Applications," 2006 IEEE International Symposium on Circuits and Systes, 2006. ISCAS 2006. May 2006, 4 pages.

Hashemi, et al., "Concurrent Multiband Low-Noise Amplifiers—Theory, Design, and Applications," IEEE Transactions on Microwave Theory and Techniques, vol. 50, No. 1, Jan. 2002.

Henrik M et al., "A Full Duplex Front End Module for WiFi 802.11.n. Applications", European Microwave Association, vol. 12, No. 4, Oct. 2008, pp. 162-165.

Hwang, et al., "A High IIP2 Direct-Conversion Receiver using Even-Harmonic Reduction Technique for Cellular CDMA/PCS/GPS applications," IEEE Transaction on Circuits and Systems, Oct. 2008.

Jones W. W., et al., "Narrowband interference suppression using filter-bank analysis/synthesis techniques", Military Communications Conference, 1992. MILCOM '92, Conference Recor d. Communications—Fusing Command, Control and Intelligence., IEEE San Diego, CA, USA, Oct. 11 14, 1992, New York, NY, USA, IEEE, US, Oct. 11, 1992, pp. 898-902, XP010060840, DOI: 10.1109/MILCOM.1992.243977, ISBN: 978-0-7803-0585-4.

Jussi R et al., "A Dual-Band RF Front-End for WCDMA and GSM Applications", IEEE, Journal Solid-State Circuits, 2001, vol. 36, No. 8, pp. 1198-1204.

Kim, T.W., et al., Highly Linear Receiver Front-End Adopting MOSFET Transconductance Linearization by Multiple Gated Transistors, IEEE Journal of Solid-State Circuits, United States, IEEE, Jan. 1, 2004, vol. 39, No. 1, pp. 223-229.

Lai, C.M.,et al., "Compact router transceiver architecture for carrier aggregation systems", Microwave Conference (EUMC), 2011 41st European, IEEE, Oct. 10, 2011, pp. 693-696, XP032072825, ISBN: 978-1-61284-235-6 the whole document.

Lee et al., "Development of Miniature Quad SAW filter bank based on PCB substrate", IEEE Intl Frequency Control Symp, pp. 146-149, 2007.

MSM6000 Chipset Solution, Qualcomm Incorporated, 2003.

MSM6500 Chipset Solution, Qualcomm Incorporated, 2004.

Pitschi M. et al., "High Performance Microwave Acoustic Components for Mobile Radios", Ultrasonics Symposium (IUS), 2009 IEEE International, EPCOS AG, Munich, Germany, vol. 1, Sep. 20-23, 2009.

Qualcomm Europe: "UE Implementation Impact due to 4C-HSDPA Operation", 3GPP Draft; R1-094067_UE_Impl_Impact_4C_HSDPA, 3rd Generation Partnership Project (3GPP), Mobile Competence Centre ; 650, Route des Lucioles ; F-06921 Sophia-Antipolis Cedex ; France, No. Miyazaki; Oct. 12, 2009, XP050388547, [retrieved on Oct. 6, 2009].

Rahn D.G., et al., "A fully integrated multiband MIMO WLAN transceiver RFIC," IEEE J. Solid-State Circuits, 2005, vol. 40 (8), 1629-1641.

Sever et al. "A Dual-Antenna Phase-Array Ultra-Wideband CMOS Transceiver". IEEE Communications Magazine [Online] 2006, vol. 44, Issue 8, pp. 102-110. See pp. 104-107.

Tasic A. et al., "Design of Adaptive Multimode RF Front-End Circuits", IEEE Journal of Solid-State Circuits, vol. 42, Issue 2, Feb. 2007 pp. 313-322.

Winternitz, et al., "A GPS Receiver for High-Altitude Satellite Navigation," IEEE Journal of Selected Topics in Signal Processing, vol. 3, No. 4, pp. 541-556, Aug. 2009.

Philips: "Capabilities of multi-transceiver UES", 3GPP Draft; R1-103913, 3rd Generation Partnership Project (3GPP), Mobile Competence Centre; 650, Route des Lucioles; F-06921 Sophia-Antipolis Cedex; France, vol. RAN WG1, No. Dresden, Germany; Jun. 22, 2010, XP050449298, [retrieved on Jun. 22, 2010] the whole document.

Kevin W et al., "3G/4G Multimode Cellular Front End Challenges", Part 2: Architecture Discussion, RFMD® White Paper, 2009, 9 pages.

"UMTS Picocell Front End Module", CTS Corp. 8 pages. 2011 via archive.org/web.

\* cited by examiner

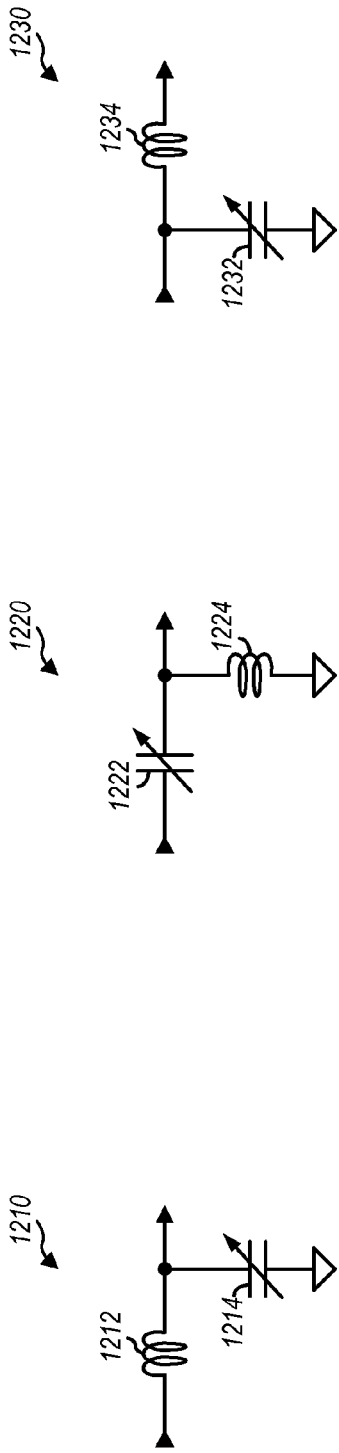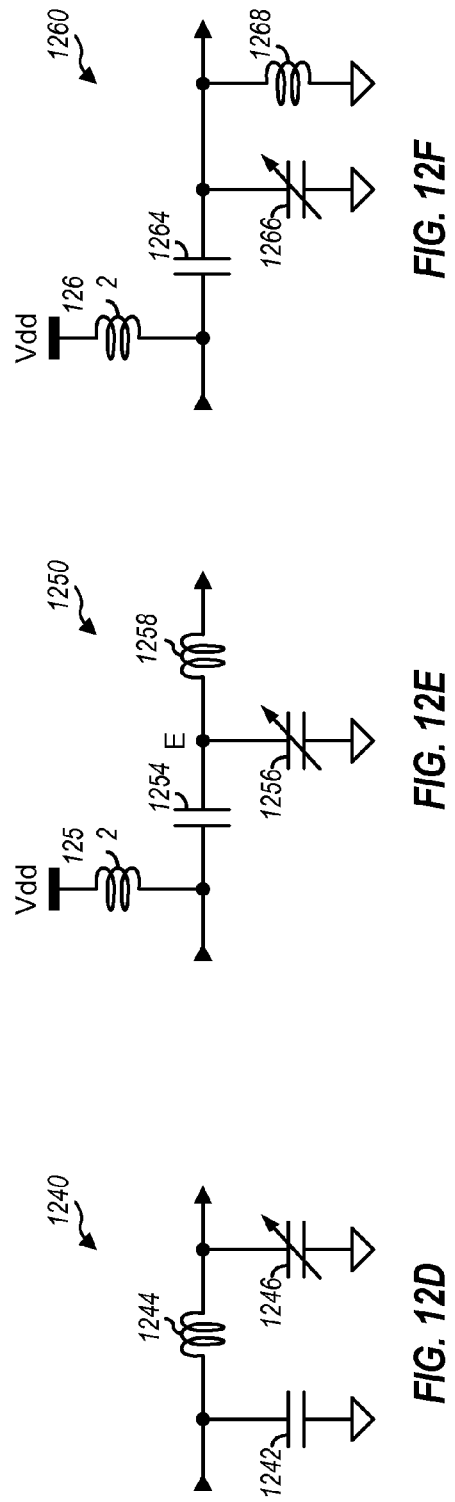

US 9,154,356 B2

LOW NOISE AMPLIFIERS FOR CARRIER AGGREGATION

CLAIM OF PRIORITY UNDER 35 U.S.C. §119

The present Application for Patent claims priority to Provisional U.S. Application Ser. No. 61/652,064, entitled "LOW NOISE AMPLIFIERS FOR CARRIER AGGREGATION," filed May 25, 2012, assigned to the assignee hereof, and expressly incorporated herein by reference.

BACKGROUND

I. Field

The present disclosure relates generally to electronics, and more specifically to low noise amplifiers (LNAs).

II. Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated RF signal, amplify the modulated RF signal to obtain an amplified RF signal having the proper output power level, and transmit the amplified RF signal via an antenna to a base station. For data reception, the receiver may obtain a received RF signal via the antenna and may amplify and process the received RF signal to recover data sent by the base station.

A wireless device may support carrier aggregation, which is simultaneous operation on multiple carriers. A carrier may refer to a range of frequencies used for communication and may be associated with certain characteristics. For example, a carrier may be associated with system information describing operation on the carrier. A carrier may also be referred to as a component carrier (CC), a frequency channel, a cell, etc. It is desirable to efficiently support carrier aggregation by the wireless device.

BRIEF DESCRIPTION OF THE DRAWINGS

FIGS. 12A to 12F show six exemplary designs of a tunable input matching circuit.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

LNAs supporting carrier aggregation are disclosed herein. These LNAs may have better performance and may be used for various types of electronic devices such as wireless communication devices.

Figure 1:
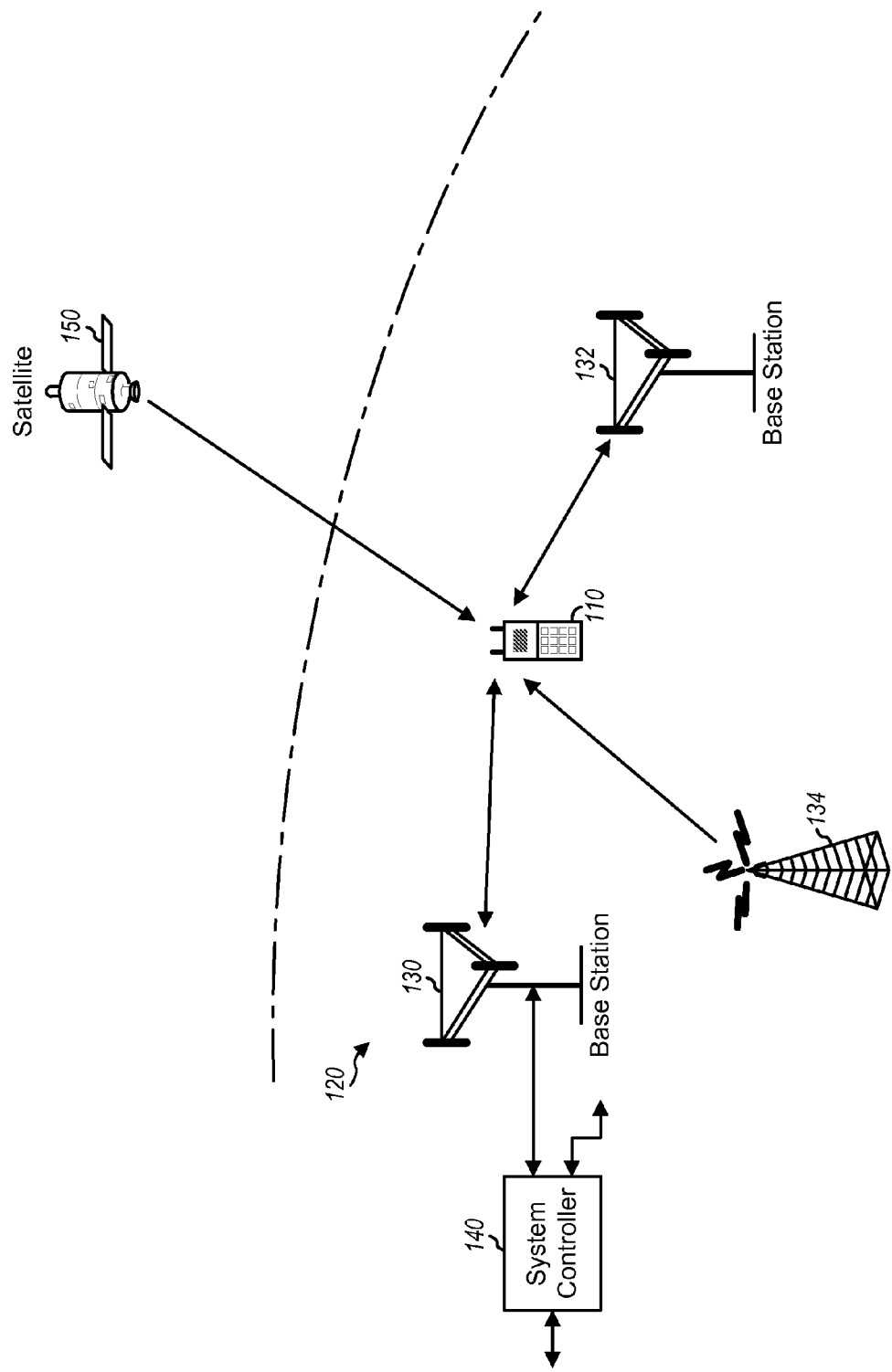
FIG. 1 shows a wireless device communicating with a wireless system.

FIG. 1 shows a wireless device 110 communicating with a wireless communication system 120. Wireless system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), cdma2000, or some other version of CDMA. For simplicity, FIG. 1 shows wireless system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may be capable of communicating with wireless system 120. Wireless device 110 may also be capable of receiving signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, cdma2000, WCDMA, GSM, 802.11, etc.

Wireless device 110 may support carrier aggregation, which is operation on multiple carriers. Carrier aggregation may also be referred to as multi-carrier operation. Wireless device 110 may be able to operate in low-band from 698 to 960 megahertz (MHz), mid-band from 1475 to 2170 MHz, and/or high-band from 2300 to 2690 and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to 5 carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
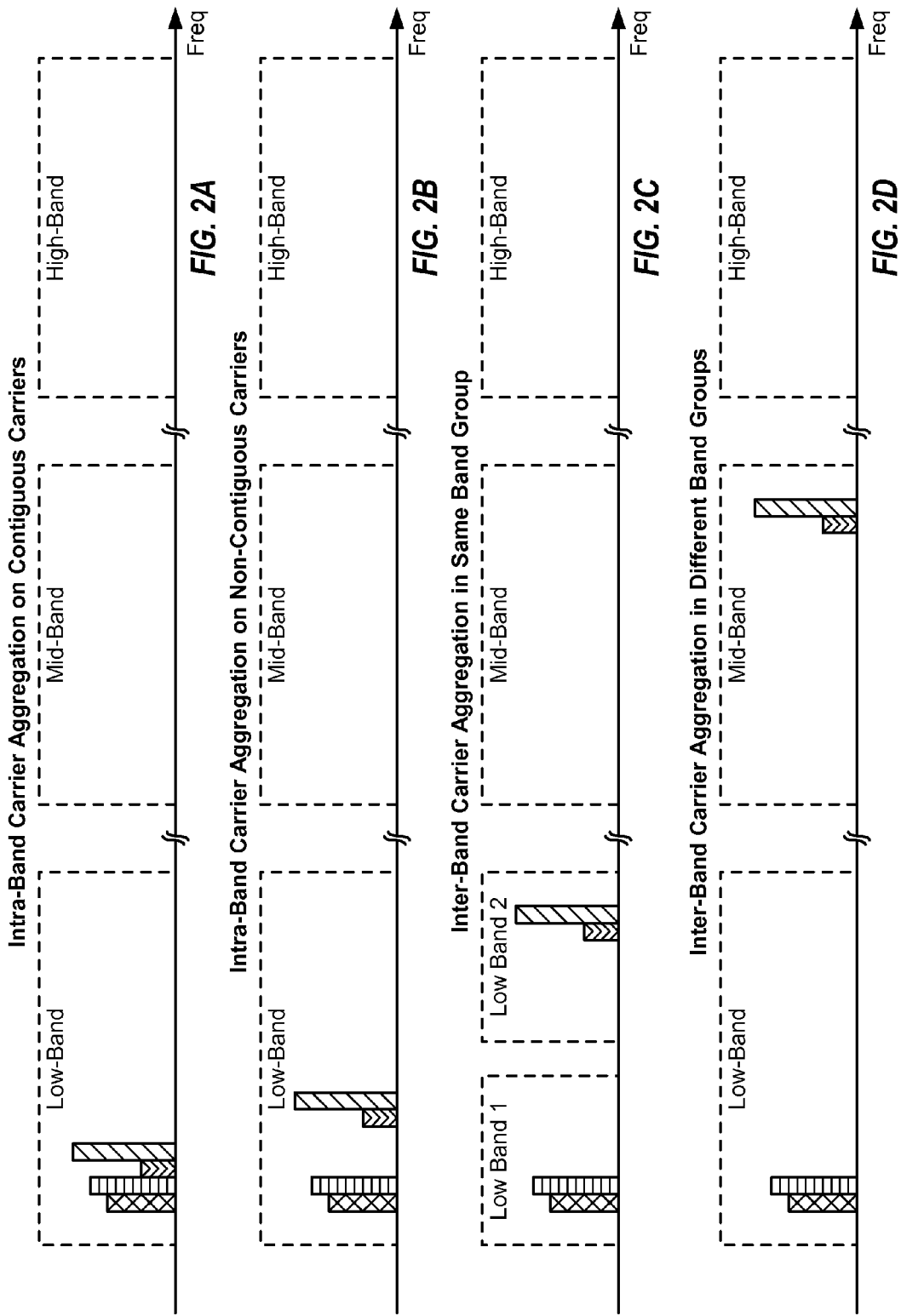
FIGS. 2A to 2D show four examples of carrier aggregation (CA).

FIG. 2A shows an example of contiguous intra-band CA. In the example shown in FIG. 2A, wireless device 110 is configured with four contiguous carriers in the same band, which is a band in low-band. Wireless device 110 may receive transmissions on multiple contiguous carriers within the same band.

FIG. 2B shows an example of non-contiguous intra-band CA. In the example shown in FIG. 2B, wireless device 110 is configured with four non-contiguous carriers in the same band, which is a band in low-band. The carriers may be separated by 5 MHz, 10 MHz, or some other amount. Wireless device 110 may receive transmissions on multiple non-contiguous carriers within the same band.

FIG. 2C shows an example of inter-band CA in the same band group. In the example shown in FIG. 2C, wireless device 110 is configured with four carriers in two bands in the same band group, which is low-band. Wireless device 110 may receive transmissions on multiple carriers in different bands in the same band group (e.g., low-band in FIG. 2C).

FIG. 2D shows an example of inter-band CA in different band groups. In the example shown in FIG. 2D, wireless device 110 is configured with four carriers in two bands in different band groups, which include two carriers in one band in low-band and two additional carriers in another band in mid-band. Wireless device 110 may receive transmissions on multiple carriers in different bands in different band groups (e.g., low-band and mid-band in FIG. 2D).

FIGS. 2A to 2D show four examples of carrier aggregation. Carrier aggregation may also be supported for other combinations of bands and band groups. For example, carrier aggregation may be supported for low-band and high-band, mid-band and high-band, high-band and high-band, etc.

Figure 3:
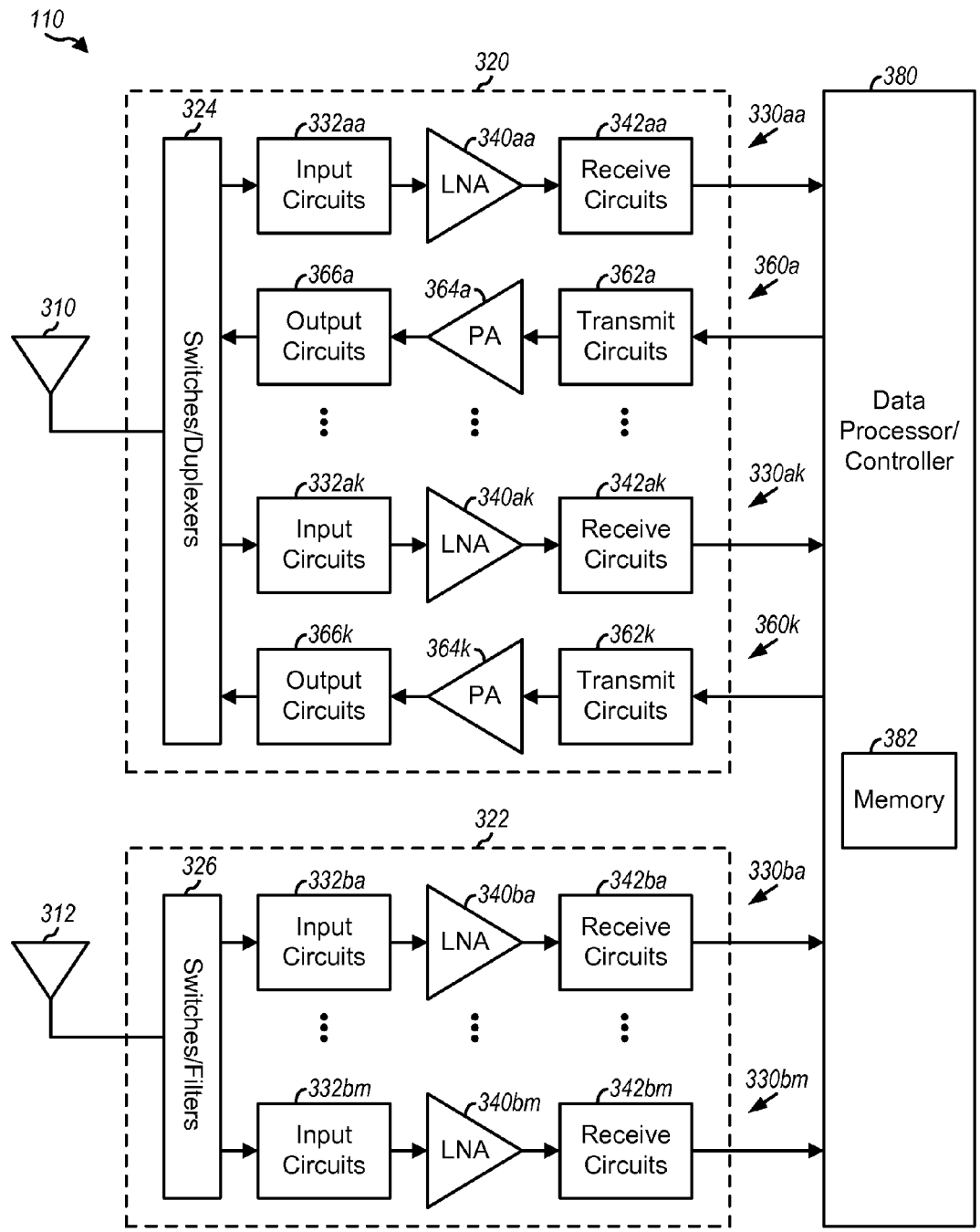
FIG. 3 shows a block diagram of the wireless device in FIG. 1.

FIG. 3 shows a block diagram of an exemplary design of wireless device 110 in FIG. 1. In this exemplary design, wireless device 110 includes a transceiver 320 coupled to a primary antenna 310, receivers 322 coupled to a secondary antenna 312, and a data processor/controller 380. Transceiver 320 includes multiple (K) receivers 330aa to 330ak and multiple (K) transmitters 360a to 360k to support multiple bands, carrier aggregation, multiple radio technologies, etc. Receivers 322 include multiple (M) receivers 330ba to 330bm to support multiple bands, carrier aggregation, multiple radio technologies, receive diversity, MIMO transmission, etc.

In the exemplary design shown in FIG. 3, each receiver 330 includes input circuits 332, an LNA 340, and receive circuits 342. For data reception, antenna 310 receives signals from base stations and/or other transmitter stations and provides a received RF signal, which is routed through switches/duplexers 324 and provided to a selected receiver. The description below assumes that receiver 330aa is the selected receiver. Within receiver 330aa, the received RF signal is passed through input circuits 332aa, which provides an input RF signal to an LNA 340aa. Input circuits 332aa may include a matching circuit, a receive filter, etc. LNA 340aa amplifies the input RF signal and provides an output RF signal. Receive circuits 342aa amplify, filter, and downconvert the output RF signal from RF to baseband and provide an analog input signal to data processor 380. Receive circuits 332aa may include mixers, a filter, an amplifier, a matching circuit, an oscillator, a local oscillator (LO) generator, a phase locked loop (PLL), etc. Each remaining receiver 330 in transceiver 320 and each receiver 330 in receivers 322 may operate in similar manner as receiver 330aa in transceiver 320.

In the exemplary design shown in FIG. 3, each transmitter 360 includes transmit circuits 362, a power amplifier (PA) 364, and output circuits 366. For data transmission, data processor 380 processes (e.g., encodes and modulates) data to be transmitted and provides an analog output signal to a selected transmitter. The description below assumes that transmitter 360a is the selected transmitter. Within transmitter 360a, transmit circuits 362a amplify, filter, and upconvert the analog output signal from baseband to RF and provide a modulated RF signal. Transmit circuits 362a may include mixers, an amplifier, a filter, a matching circuit, an oscillator, an LO generator, a PLL, etc. A PA 364a receives and amplifies the modulated RF signal and provides an amplified RF signal having the proper output power level. The amplified RF signal is passed through output circuits 366a, routed through switches/duplexers 324, and transmitted via antenna 310. Output circuits 366a may include a matching circuit, a transmit filter, a directional coupler, etc.

FIG. 3 shows an exemplary design of receivers 330 and transmitters 360. A receiver and a transmitter may also include other circuits not shown in FIG. 3, such as filters, matching circuits, etc. All or a portion of transceiver 320 and receivers 322 may be implemented on one or more analog integrated circuits (ICs), RF ICs (RFICs), mixed-signal ICs, etc. For example, LNAs 340, receive circuits 342, and transmit circuits 362 may be implemented on one module, which may be an RFIC, etc. Switches/duplexers 324, switches/filters 326, input circuits 332, output circuits 366, and PAs 364 may be implemented on another module, which may be a hybrid module, etc. The circuits in receivers 330 and transmitters 360 may also be implemented in other manners.

Data processor/controller 380 may perform various functions for wireless device 110. For example, data processor 380 may perform processing for data being received via receivers 330 and data being transmitted via transmitters 360. Controller 380 may control the operation of switches/duplexers 324, switches/filters 326, input circuits 332, LNAs 340, receive circuits 342, transmit circuits 362, PAs 364, output circuits 366, or a combination thereof. A memory 382 may store program codes and data for data processor/controller 380. Data processor/controller 380 may be implemented on one or more application specific integrated circuits (ASICs) and/or other ICs.

Wireless device 110 may receive multiple transmissions from one or more cells/base stations on multiple carriers at different frequencies for carrier aggregation. For intra-band CA, the multiple transmissions are sent on multiple carriers in the same band. For inter-band CA, the multiple transmissions are sent on multiple carriers in different bands.

Figure 4A:
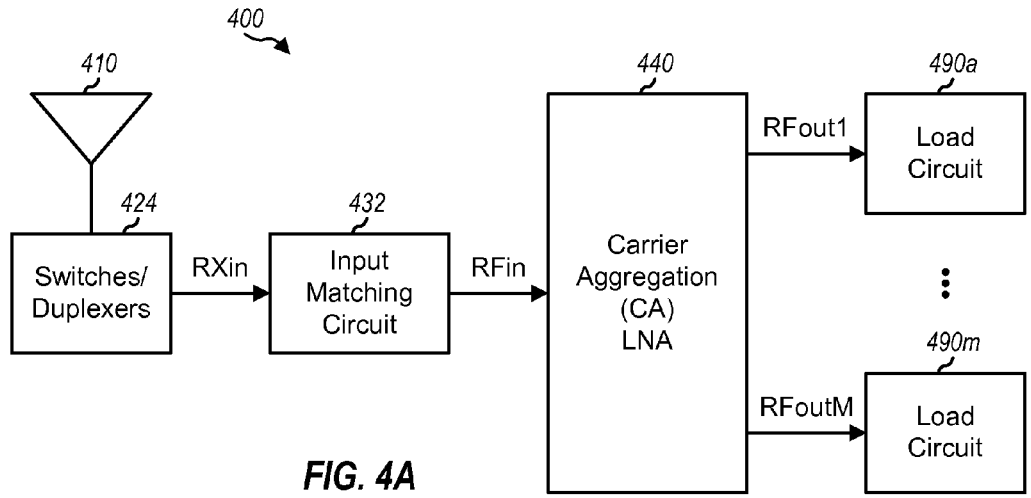
FIGS. 4A and 4B show a receiver supporting intra-band CA.

FIG. 4A shows a block diagram of an exemplary design of a receiver 400 that includes a CA LNA 440 supporting no CA and intra-band CA. CA LNA 440 may be used for one or more LNAs 340 within wireless device 110 in FIG. 3.

At receiver 400, an antenna 410 receives transmissions on multiple carriers in the same band and provides a received RF signal. The received RF signal is routed through switches/duplexers 424 and provided as a receiver input signal, RXin, to an input matching circuit 432. Matching circuit 432 performs power and/or impedance matching between CA LNA 440 and either switches/duplexers 424 or antenna 410 for one or more bands of interest. Matching circuit 432, which may be part of one of input circuits 332 in FIG. 3, provides an input RF signal, RFin, to CA LNA 440.

CA LNA 440 receives the input RF signal from matching circuit 432, amplifies the input RF signal, and provides up to M output RF signals, RFout1 to RFoutM, via up to M LNA outputs, where M>1. M load circuits 490a to 490m are coupled to the M LNA outputs. Each load circuit 490 may include one or more inductors, capacitors, transistors, mixers, etc. Each load circuit 490 may be part of one of receive circuits 342 in FIG. 3. Each output RF signal may be provided to one or more mixers within one load circuit 490 and may be downconverted by the associated mixer(s) such that transmissions on one or more carriers of interest are downconverted from RF to baseband.

A CA LNA, such as CA LNA 440 in FIG. 4A, may operate in a non-CA mode or a CA mode at any given moment. In the non-CA mode, the CA LNA operates in a 1-input 1-output (1×1) configuration, receives one input RF signal comprising one or more transmissions on one set of carriers, and provides one output RF signal to one load circuit. In the CA mode, the CA LNA operates in a 1×M configuration, receives one input RF signal comprising multiple transmissions on M sets of carriers, and provides M output RF signals to M load circuits, one output RF signal for each set of carriers, where M>1. Each set of carriers may include one or more carriers in one band.

Figure 4B:
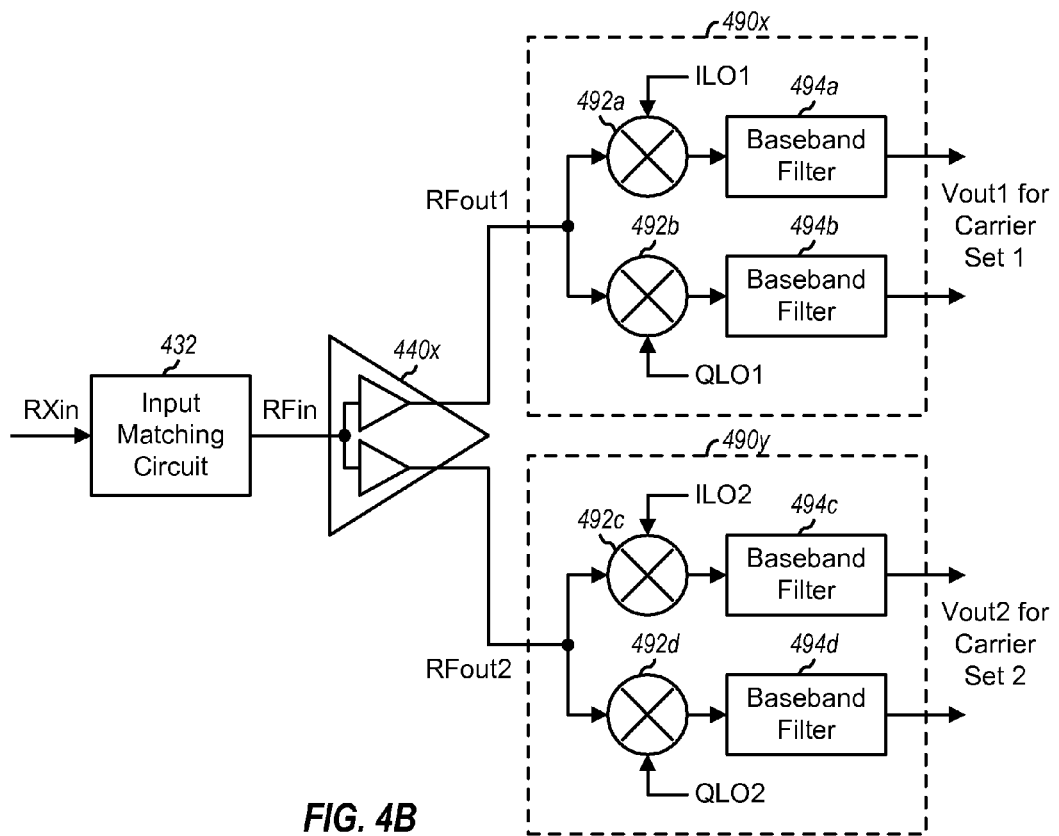

FIG. 4B shows a schematic diagram of an exemplary design of a CA LNA 440x supporting no CA and intra-band CA on two sets of carriers in the same band. CA LNA 440x is one exemplary design of CA LNA 440 in FIG. 4A. In the exemplary design shown in FIG. 4B, CA LNA 440x receives an input RF signal from input matching circuit 432 and provides up to two output RF signals, RFout1 and RFout2, for up to two sets of carriers. The first output RF signal is provided to a load circuit 490x, and the second output RF signal is provided to a load circuit 490y.

In the exemplary design shown in FIG. 4B, load circuit 490x includes two mixers 492a and 492b coupled to two baseband filters 494a and 494b, respectively. Mixers 492a and 492b implement a quadrature downconverter for a first set of carriers. Mixer 492a receives the first output RF signal from CA LNA 440x and an inphase LO signal, ILO1, at a first mixing frequency for the first set of carriers. Mixer 492a downconverts the first output RF signal with the ILO1 signal and provides an inphase (I) downconverted signal. Mixer 492b receives the first output RF signal from CA LNA 440x and a quadrature LO signal, QLO1, at the first mixing frequency for the first set of carriers. Mixer 492b downconverts the first output RF signal with the QLO1 signal and provides a quadrature (Q) downconverted signal. Filters 494a and 494b receive and filter the I and Q downconverted signals from mixers 492a and 492b, respectively, and provide I and Q baseband signals, Vout1, for the first set of carriers.

Mixers 492c and 492d and filters 494c and 494d within load circuit 490y similarly process the second output RF signal from CA LNA 440x and provide I and Q baseband signals for a second set of carriers. Mixers 492c and 492d receive the second RF signal and I and Q LO signals, respectively, at a second mixing frequency for the second set of carriers. Mixers 492c and 492d downconvert the second output RF signal with the I and Q LO signals and provide the I and Q downconverted signals, respectively. Filters 494c and 494d receive and filter the I and Q downconverted signals from mixers 492c and 492d, respectively, and provide I and Q baseband signals, Vout2, for the second set of carriers.

FIG. 4B shows an exemplary design of load circuits 490x and 490y. A load circuit may also comprise different and/or additional circuits. For example, a load circuit may include an amplifier coupled before the mixers, or between the mixers and the filters, or after the filters.

Figure 5A:
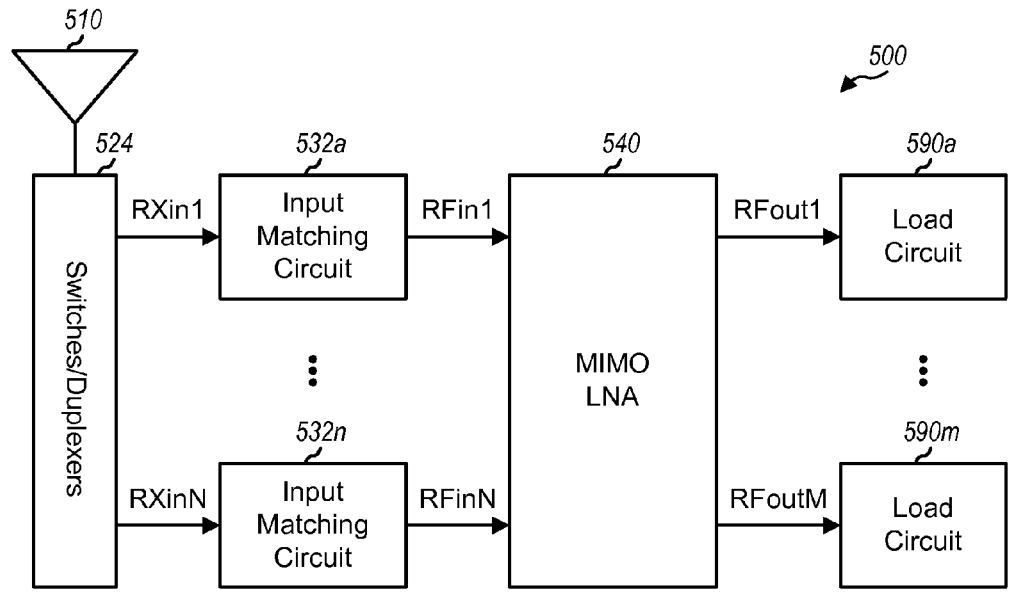
FIGS. 5A and 5B show a receiver supporting intra-band CA and inter-band CA.

FIG. 5A shows a block diagram of an exemplary design of a receiver 500 that includes a MIMO LNA 540 supporting no CA, intra-band CA, and inter-band CA. MIMO LNA 540 may be used for one or more LNAs 340 within wireless device 110 in FIG. 3.

At receiver 500, an antenna 510 receives transmissions on one or more carriers in the same band or different bands and provides a received RF signal to switches/duplexers 524. Switches/duplexers 524 provide up to N receiver input signals, RXin1 to RXinN, to up to N input matching circuits 532a to 532n, respectively, where N>1. Matching circuits 532a to 532n may be part of one or more input circuits 332 in FIG. 3. Each matching circuit 532 performs power and/or impedance matching between MIMO LNA 540 and either switches/duplexers 524 or antenna 510 for one or more bands of interest. The N matching circuits 532a to 532n may be designed for different bands and may provide up to N input RF signals, RFin1 to RFinN.

MIMO LNA 540 receives up to N input RF signals and amplifies (i) one input RF signal for no CA or intra-band CA or (ii) multiple input RF signals for inter-band CA. MIMO LNA 540 provides up to M output RF signals, RFout1 to RFoutM, via up to M LNA outputs. M load circuits 590a to 590m are coupled to the M LNA outputs. Each load circuit 590 may include one or more inductors, capacitors, transistors, mixers, etc. Each output RF signal may be provided to one or more mixers within one load circuit 590 and may be downconverted by the associated mixer(s) such that one or more transmissions on one or more carriers of interest are downconverted from RF to baseband.

A MIMO LNA, such as MIMO LNA 540 in FIG. 5A, may operate in a non-CA mode, an intra-band CA mode, or an inter-band CA mode at any given moment. In the non-CA mode, the MIMO LNA operates in a 1×1 configuration, receives one input RF signal comprising one or more transmissions on one set of carriers, and provides one output RF signal to one load circuit. In the intra-band CA mode, the MIMO LNA operates in a 1×M configuration, receives one input RF signal comprising multiple transmissions on M sets of carriers in the same band, and provides M output RF signals to M load circuits, one output RF signal for each set of carriers, where M>1. In the inter-band CA mode, the MIMO LNA operates in an N×M configuration, receives N input RF signals comprising multiple transmissions on M sets of carriers in up to N different bands, and provides M output RF signals to M load circuits, where M>1 and N>1. The N input RF signals may correspond to up to N different bands.

A MIMO LNA, such as MIMO LNA 540 in FIG. 5A, may be used to receive transmissions on multiple carriers at different frequencies. A MIMO LNA may include multiple outputs providing multiple output RF signals for different carriers or different sets of carriers of interest. A MIMO LNA is different from LNAs used to receive a MIMO transmission sent from multiple transmit antennas to multiple receive antennas. An LNA for a MIMO transmission typically has (i) one input receiving one input RF signal from one receive antenna and (ii) one output providing one output RF signal. The multiple outputs of a MIMO LNA thus cover frequency dimension whereas the outputs of LNAs used for a MIMO transmission cover spatial dimension.

Figure 5B:
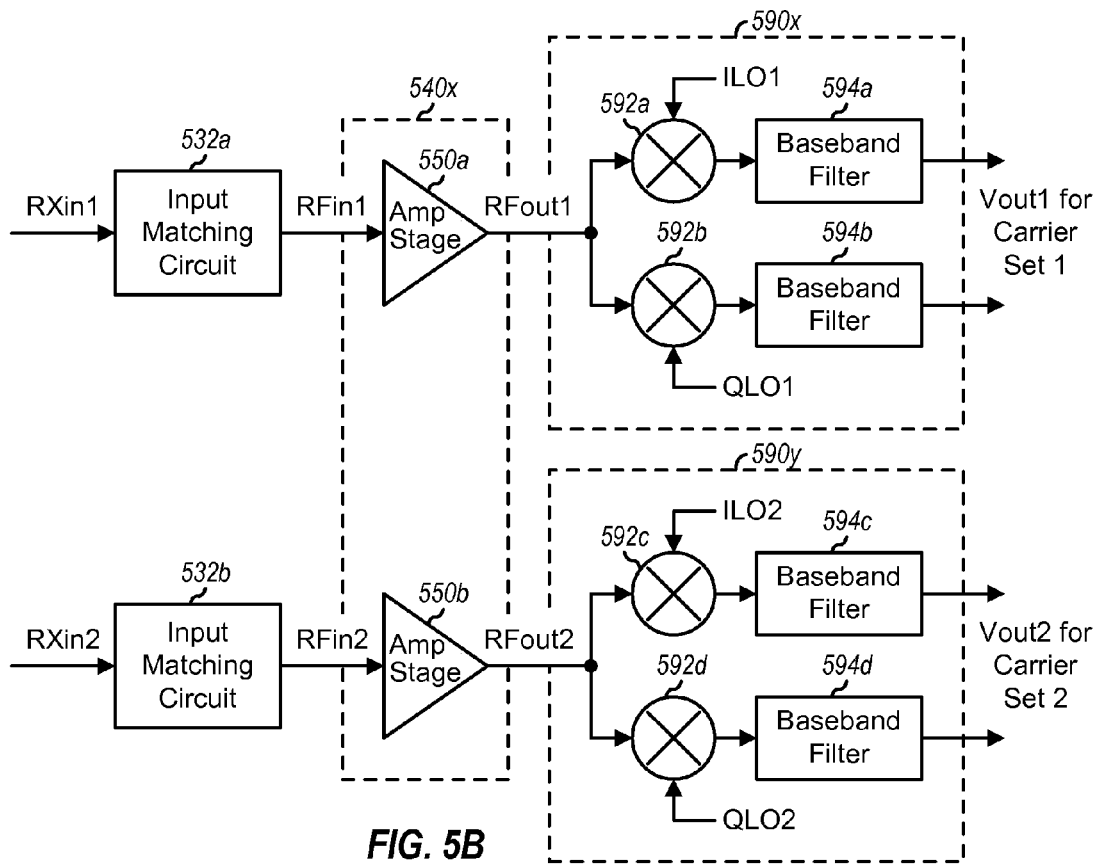

FIG. 5B shows a schematic diagram of an exemplary design of a MIMO LNA 540x supporting no CA, intra-band CA, and inter-band CA on two sets of carriers in different bands. Each set of carriers may include one or more carriers in one band. MIMO LNA 540x is one exemplary design of MIMO LNA 540 in FIG. 5A. Matching circuits 532a and 532b may receive (i) the same receiver input signal from one antenna or (ii) different receiver input signals from one or more antennas. Hence, the RXin2 signal may or may not be equal to the RXin1 signal in FIG. 5B. Each matching circuit 532 performs power and/or impedance matching for one or more bands of interest.

In the exemplary design shown in FIG. 5B, MIMO LNA 540x includes two amplifier stages 550a and 550b for two sets of carriers. Amplifier stage 550a receives and amplifies the first input RF signal from matching circuit 532a and provides a first output RF signal, RFout1, for a first set of carriers. Amplifier stage 550b receives and amplifies the second input RF signal from matching circuit 532b and provides a second output RF signal, RFout2, for a second set of carriers. Although not shown in FIG. 5B for simplicity, MIMO LNA 540x may include circuitry to route an output RF signal from each amplifier stage 550 to any one of load circuits 590x and 590y.

In the exemplary design shown in FIG. 5B, load circuit 590x includes two mixers 592a and 592b coupled to two baseband filters 594a and 594b, respectively. Mixer 592a receives the first output RF signal from amplifier stage 550a and an inphase LO signal, ILO1, at a first mixing frequency for the first set of carriers. Mixer 592a downconverts the first output RF signal with the ILO1 signal and provides an I downconverted signal. Mixer 592b receives the first output RF signal from amplifier stage 550b and a quadrature LO signal, QLO1, at the first mixing frequency for the first set of carriers. Mixer 592b downconverts the first output RF signal with the QLO1 signal and provides a Q downconverted signal. Filters 594a and 594b receive and filter the I and Q downconverted signals from mixers 592a and 592b, respectively, and provide I and Q baseband signals, Vout1, for the first set of carriers.

Mixers 592c and 592d and filters 594c and 594d within load circuit 590y similarly process the second output RF signal from amplifier stage 550b and provide I and Q baseband signals, Vout2, for a second set of carriers.

CA LNA 440 in FIG. 4A may be implemented in various manners. Some exemplary designs of CA LNA 440 are described below. CA LNA 440 may also be implemented with transistors of various types. Some exemplary designs of CA LNA 440 using N-channel metal oxide semiconductor (NMOS) transistors are described below.

Figure 6A:
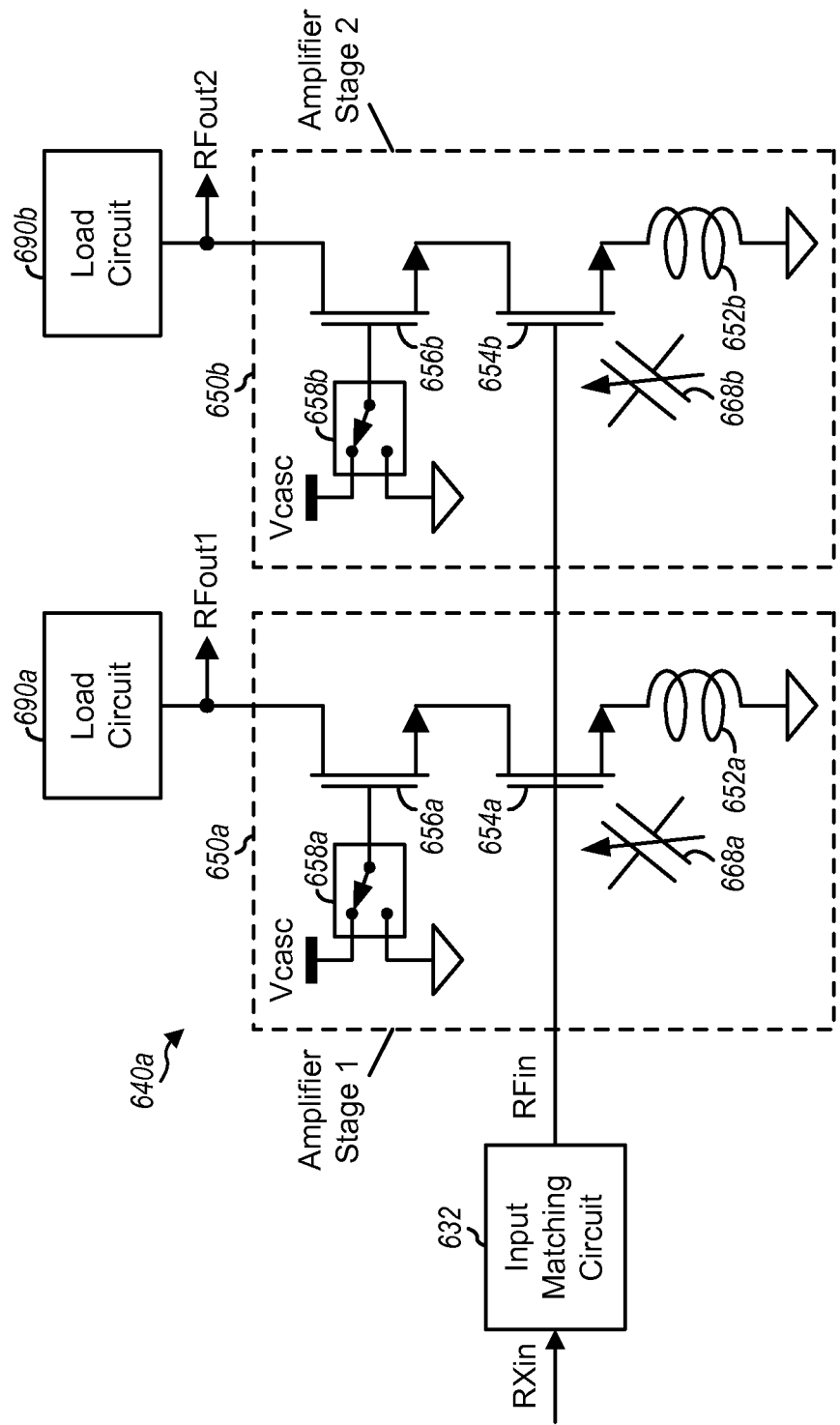
FIGS. 6A to 6C show an LNA with inductive degeneration and cascode shutoff.

FIG. 6A shows a schematic diagram of an exemplary design of a CA LNA 640a with inductive degeneration and cascode shutoff CA LNA 640a is one exemplary design of CA LNA 440 in FIG. 4A. CA LNA 640a includes two amplifier stages 650a and 650b coupled to a common input matching circuit 632 and to two load circuits 690a and 690b. Matching circuit 632 receives a receiver input signal, RXin, performs input matching for CA LNA 640a, and provides an input RF signal, RFin. Matching circuit 632 may correspond to matching circuit 432 in FIG. 4A. Load circuits 690a and 690b may correspond to load circuits 490a and 490m in FIG. 4A. CA LNA 640a receives the input RF signal, which may include transmissions on two sets of carriers, with each set including one or more carriers.

In the exemplary design shown in FIG. 6A, amplifier stage 650a includes a source degeneration inductor 652a, a gain transistor 654a, and a cascode transistor 656a. Gain transistor 654a and cascode transistor 656a may be implemented with NMOS transistors (as shown in FIG. 6A) or with transistors of other types. Gain transistor 654a has its gate coupled to matching circuit 632 and its source coupled to one end of inductor 652a. The other end of inductor 652a is coupled to circuit ground. Cascode transistor 656a has its source coupled to the drain of gain transistor 654a and its drain coupled to load circuit 690a. A switch 658a has its input port coupled to the gate of cascode transistor 656a, its first output port coupled to a bias voltage, Vcasc, and its second output port coupled to circuit ground. Amplifier stage 650b includes a source degeneration inductor 652b, a gain transistor 654b, a cascode transistor 656b, and a switch 658b, which are coupled in similar manner as inductor 652a, gain transistor 654a, cascode transistor 656a, and switch 658a in amplifier stage 650a.

For simplicity, FIG. 6A shows CA LNA 640a including two amplifier stages 650a and 650b for two sets of carriers. Amplifier stages 650a and 650b may be independently enabled or disabled via switches 658a and 658b, respectively. CA LNA 640a may include more than two amplifier stages 650 for more than two sets of carriers.

An input RF signal may include transmissions on multiple sets of carriers in the same band and may be referred to as a carrier-aggregated RF signal. The carrier-aggregated RF signal may be downconverted using LO signals at different frequencies corresponding to the center frequencies of the multiple sets of carriers on which the transmissions are sent. The carrier-aggregated RF signal may be split at the LNA input in order to achieve good LO-LO isolation between the LO signals for the multiple sets of carriers. CA LNA 640a includes two amplifier stages 650a and 650b to amplify the carrier-aggregated RF signal and provide two output RF signals to two separate downconverters in the two load circuits 690a and 690b.

CA LNA 640a may operate in a non-CA mode or a CA mode at any given moment. In the non-CA mode, CA LNA 640a receives transmissions on one set of carriers and provides one output RF signal to one load circuit. In the CA mode, CA LNA 640a receives transmissions on two sets of carriers and provides two output RF signals to two load circuits, one output RF signal for each set of carriers.

Figure 6B:
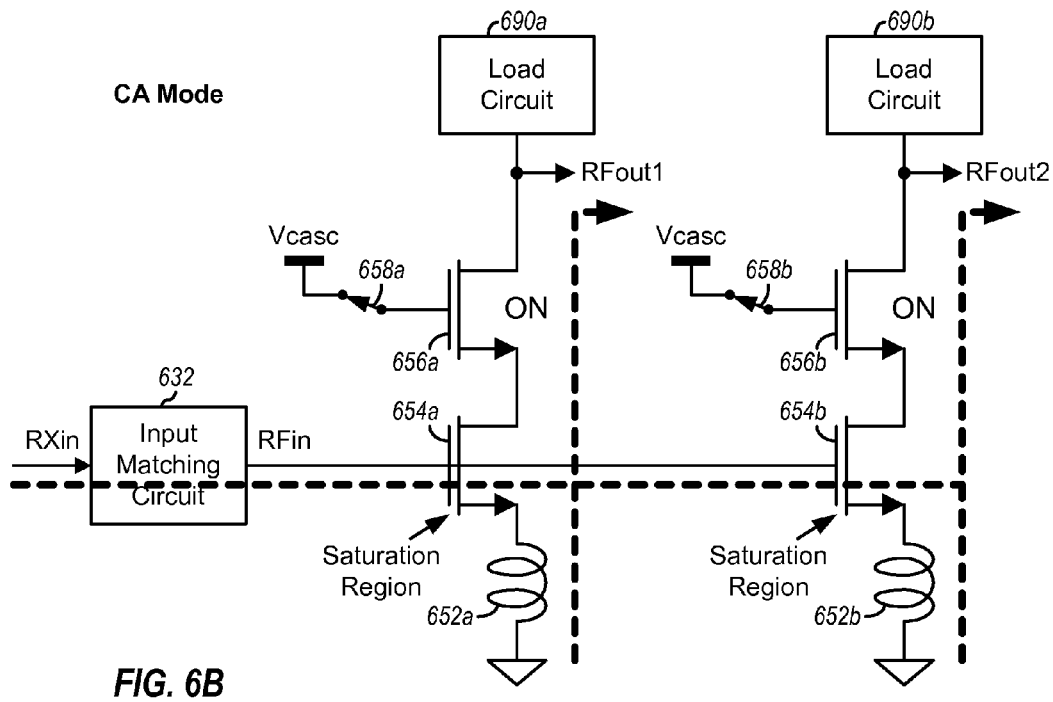

FIG. 6B shows operation of CA LNA 640a in the CA mode. In the CA mode, both amplifier stages 650a and 650b are enabled by connecting the gate of cascode transistor 656a to the Vcasc voltage via switch 658a and coupling the gate of cascode transistor 656b to the Vcasc voltage via switch 658b. Amplifier stage 650a amplifies the input RF signal and provides the first output RF signal to load circuit 690a. Amplifier stage 650b amplifies the input RF signal and provides the second output RF signal to load circuit 690b.

Figure 6C:
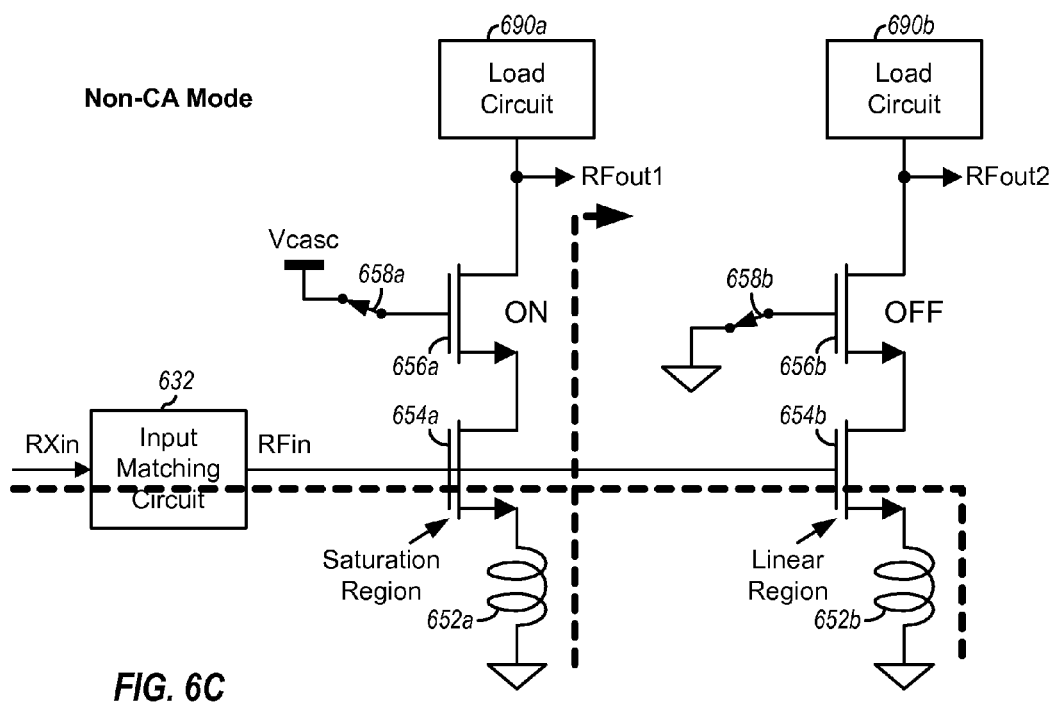

FIG. 6C shows operation of CA LNA 640a in the non-CA mode. In the non-CA mode, only one amplifier stage is enabled, and the other amplifier stage is disabled. In the example shown in FIG. 6C, amplifier stage 650a is enabled by connecting the gate of cascode transistor 656a to the Vcasc voltage via switch 658a, and amplifier stage 650b is disabled by shorting the gate of cascode transistor 656b to circuit ground via switch 658b. Amplifier stage 650a amplifies the input RF signal and provides an output RF signal to load circuit 690a.

In another configuration of the non-CA mode, amplifier stage 650b is enabled, and amplifier stage 650a is disabled (not shown in FIG. 6C). In this configuration, amplifier stage 650b amplifies the input RF signal and provides an output RF signal to load circuit 690b.

In the exemplary design shown in FIG. 6A, separate source degeneration inductors 652a and 652b are used for amplifier stages 650a and 650b in order to reduce interaction between the two amplifier stages and to help reduce noise figure (NF) degradation. Source degeneration inductors 652a and 652b may also improve linearity of amplifier stages 650a and 650b and help input impedance matching of CA LNA 640a. Inductors 652a and 652b may have the same value or different values. The values of inductors 652a and 652b may be selected (e.g., independently) based on a trade-off between voltage gain and linearity in the CA mode and the non-CA mode.

As shown in FIG. 6A, a variable capacitor 668a may be present across the gate and source of gain transistor 654a. Capacitor 668a may include parasitic of gain transistor 654a. Capacitor 668a may also include a bank of switchable capacitors, which may be coupled between the gate and source of gain transistor 654a and may be used to fine-tune the input impedance of CA LNA 640a. Each switchable capacitor may be implemented with a capacitor coupled in series with a switch. Similarly, a variable capacitor 668b may be present across the gate and source of gain transistor 654b. Capacitor 668b may include a bank of switchable capacitors, which may be coupled between the gate and source of gain transistor 654b and may be used to fine-tune the input impedance.

Input matching circuit 632 is common to both amplifier stages 650a and 650b and is used in both the CA mode and the non-CA mode. In the CA mode, both amplifier stages 650a and 650b are enabled, and gain transistors 654a and 654b operate in a saturation region, as shown in FIG. 6B. In the non-CA mode, one amplifier stage (e.g., amplifier stage 650a) is enabled, and the other amplifier stage (e.g., amplifier stage 650b) is disabled. However, the gain transistor in the disabled amplifier stage (e.g., gain transistor 654b in amplifier stage 650b) is turned On by the input RF signal that is applied to both gain transistors 654a and 654b. Since the cascode transistor in the disabled amplifier stage (e.g., cascode transistor 656b) is turned Off, the gain transistor in the disabled amplifier stage operates in a linear region. Hence, a gain transistor may operate in the saturation region when an amplifier stage is enabled and may operate in the linear region when the amplifier stage is disabled. Operating the gain transistor of the disabled amplifier stage in the linear region may help to reduce changes in the input impedance of CA LNA 640a between the CA mode and the non-CA mode, without a current penalty in the disabled amplifier stage. In particular, the input capacitance, $C_{IN}$, of a given gain transistor (e.g., gain transistor 654b) in an enabled amplifier stage and in a disabled amplifier stage may be expressed as:

$$C_{IN} = \frac{2}{3} \cdot W \cdot L \cdot C_{OX} \quad \text{amplifer stage is enabled, and} \quad \text{Eq (1)}$$

$$C_{IN} = \frac{1}{2} \cdot W \cdot L \cdot C_{OX} \quad \text{amplifer stage is disabled,} \quad \text{Eq (2)}$$

where W is the width and L is the length of gain transistor 654b, and $C_{OX}$ is a gate oxide capacitance of gain transistor 654b.

As shown in equations (1) and (2), there may be a finite change in the input impedance of a gain transistor depending on whether an amplifier stage is enabled or disabled. However, the input impedance of CA LNA 640a may be maintained within tolerable limits even with the change in the input impedance of the gain transistor.

CA LNA 640a splits the carrier-aggregated RF signal at the "gate" level by having the carrier-aggregated RF signal applied to two gain transistors 654a and 654b. The carrier-aggregated RF signal may also be split at the "cascode" level by having the carrier-aggregated RF signal applied to a single gain transistor driving two cascode transistors. Splitting the carrier-aggregated RF signal at the gate level (as shown in FIG. 6A) may provide better performance (e.g., better gain, noise figure, linearity, and isolation) than splitting the carrier-aggregated RF signal at the cascode level. For example, splitting the carrier-aggregated RF signal at the gate level may provide good LO-LO isolation of about 35 dB whereas splitting the carrier-aggregated RF signal at the cascode level may provide LO-LO isolation of only about 15 dB.

Figure 7:
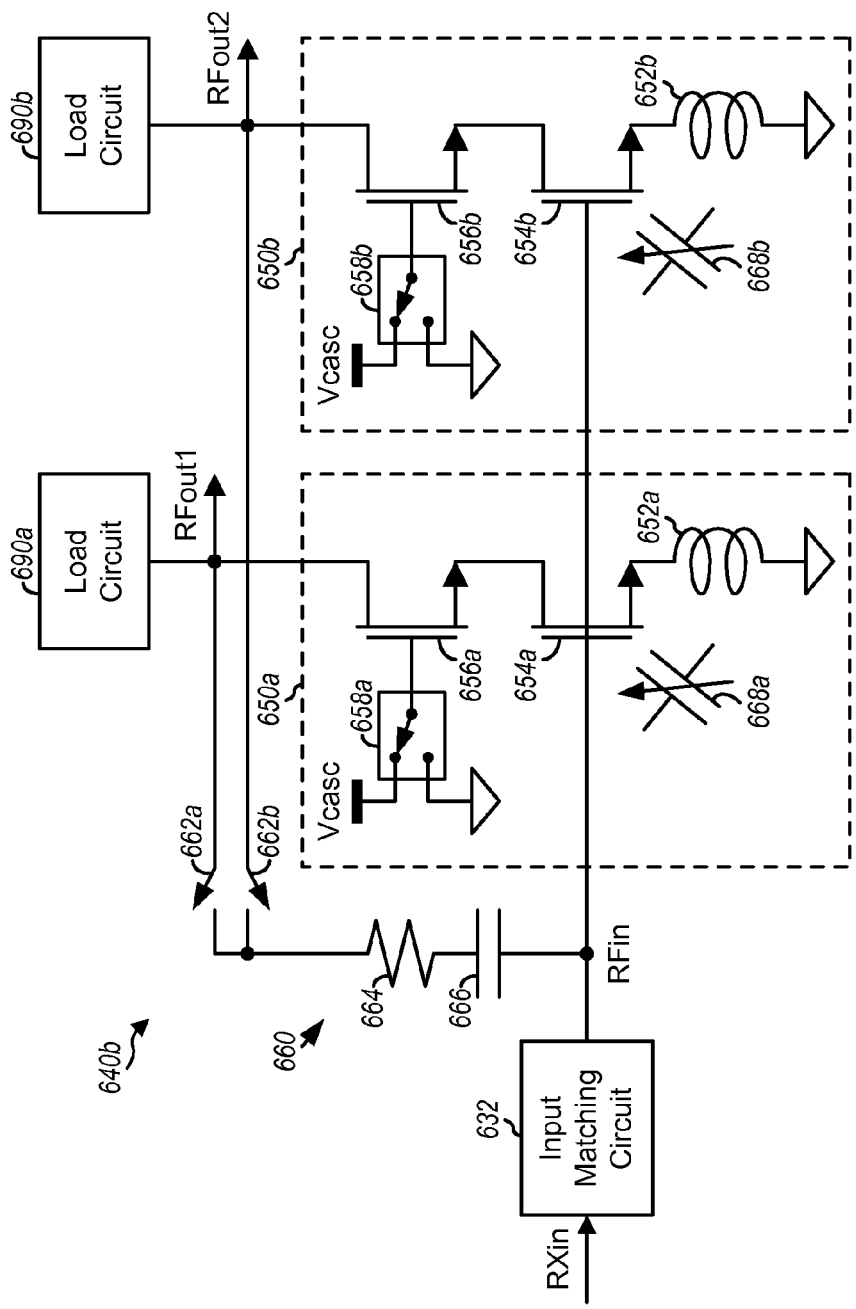
FIG. 7 shows an LNA with inductive degeneration, cascode shutoff, and resistive feedback.

FIG. 7 shows a schematic diagram of an exemplary design of a CA LNA 640b with inductive degeneration, cascode shutoff, and resistive feedback. CA LNA 640b is another exemplary design of CA LNA 440 in FIG. 4A. CA LNA 640b includes two amplifier stages 650a and 650b coupled to a common input matching circuit 632 and to two load circuits 690a and 690b, similar to CA LNA 640a in FIG. 6A. CA LNA 640b further includes a feedback circuit 660 coupled between the drains of cascode transistors 656a and 656b and the gates of gain transistors 654a and 654b, i.e., between the input and output of amplifier stages 650a and 650b.

In the exemplary design shown in FIG. 7, feedback circuit 660 includes switches 662a and 662b, a resistor 664, and a capacitor 666. Resistor 664 and capacitor 666 are coupled in series, with the bottom terminal of capacitor 666 being coupled to the gates of gain transistors 654a and 654b. Switch 662a is coupled between the drain of cascode transistor 656a and the top terminal of resistor 664. Switch 662b is coupled between the drain of cascode transistor 656b and the top terminal of resistor 664. Switches 662a and 662b may each be closed to connect feedback circuit 660 to its associated cascode transistor 656 and may be opened to disconnect feedback circuit 660 from the associated cascode transistor 656. A feedback path from RFout1 to feedback circuit 660 may be formed by closing switch 662a. A feedback path from RFout2 to feedback circuit 660 may be formed by closing switch 662b. Feedback circuit 660 may also include one or more active circuits such as a transistor. In an exemplary design, feedback circuit 660 may be used/enabled for low-band to provide input power match. For mid-band and high-band, feedback circuit 660 may be disabled, and source degeneration inductors 652a and 652b may be used with matching circuit 632 for input power match. Feedback circuit 660 may also be used in other manners.

Input matching circuit 632 is common to both amplifier stages 650a and 650b and is used in both the CA mode and the non-CA mode. In the CA mode, input matching for CA LNA 640b may be achieved with feedback circuit 660 around amplifier stages 650a and 650b as well as source degeneration inductors 652a and 652b. In the non-CA mode, input matching for CA LNA 640b may be achieved with feedback circuit 660 and source degeneration inductor 652a and 652b. Feedback circuit 660 may help with input matching for the entire LNA 640b in both the CA mode and the non-CA mode. Input matching for CA LNA 640b may be achieved (i) with feedback circuit 660 and source degeneration inductor 652a for RFout1 and (ii) with feedback circuit 660 and source degenerated inductor 652b for RFout2.

Amplifier stage 650a may be linearized by (i) both source degeneration inductor 652a and feedback circuit 660 when feedback circuit 660 is selected or (ii) only source degeneration inductor 652a when feedback circuit 660 is not selected. Feedback circuit 660 may improve the linearity of amplifier stage 650a in both the CA mode and the non-CA mode. This may allow a smaller inductor 652a to be used for amplifier stage 650a to obtain the desired linearity. Similarly, amplifier stage 650b may be linearized by (i) both source degeneration inductor 652b and feedback circuit 660 when feedback circuit 660 is selected or (ii) only source degeneration inductor 652b when feedback circuit 660 is not selected. A smaller inductor may be used for inductor 652a and/or 652b to obtain the desired linearity for amplifier stage 650b with feedback circuit 660 enabled.

Figure 8A:
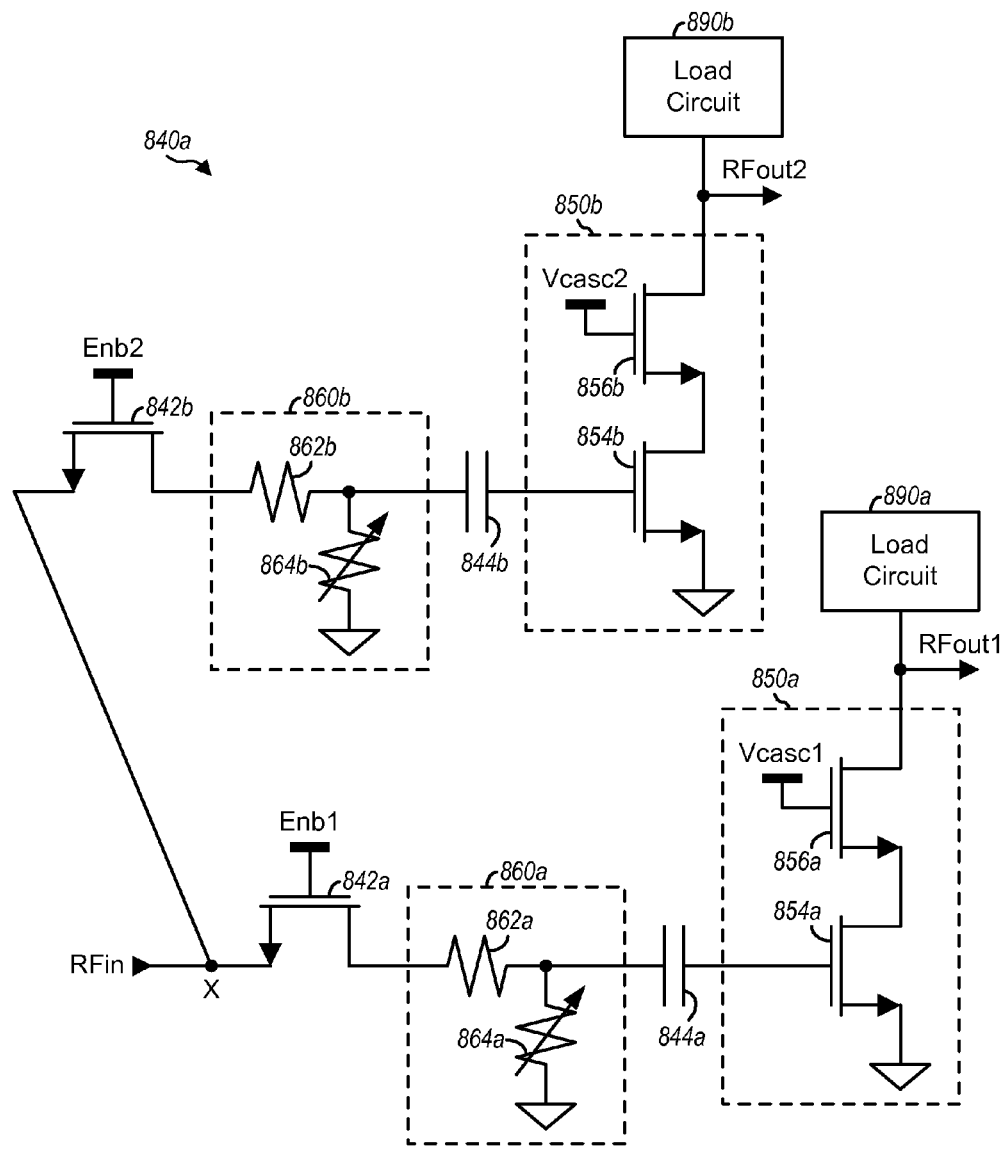
FIG. 8A shows an LNA with a separate input attenuation circuit for each amplifier stage.

FIG. 8A shows a schematic diagram of an exemplary design of a CA LNA 840a with a separate input attenuation circuit for each amplifier stage. CA LNA 840a is yet another exemplary design of CA LNA 440 in FIG. 4A. CA LNA 840a includes two amplifier stages 850a and 850b coupled to two input attenuation circuits 860a and 860b and to two load circuits 890a and 890b.

An input RF signal is provided to the input of CA LNA 840a, which is node X. Amplifier stage 850a is coupled to node X via an NMOS transistor 842a operating as a switch, attenuation circuits 860a, and an AC coupling capacitor 844a. NMOS transistor 842a has its source coupled to node X, its gate receiving a first control signal, Enb1, and its drain coupled to the input of attenuation circuit 860a. Attenuation circuit 860a includes (i) a resistor 862a coupled between the input and output of attenuation circuit 860a and (ii) a variable resistor 864a coupled between the output of attenuation circuit 860a and circuit ground. AC coupling capacitor 844a is coupled between the output of attenuation circuit 860a and the input of amplifier stage 850a. Amplifier stage 850b is coupled to node X via an NMOS transistor 842b, an attenuation circuit 860b, and an AC coupling capacitor 844b, which are coupled in similar manner as NMOS transistor 842a, attenuation circuit 860a, and AC coupling capacitor 844a.

Amplifier stage 850a includes a gain transistor 854a and a cascode transistor 856a. Gain transistor 854a has its gate coupled to AC coupling capacitor 844a and its source coupled to circuit ground (as shown in FIG. 8A) or to a source degeneration inductor (not shown in FIG. 8A). Cascode transistor 856a has its gate receiving a first bias voltage, Vcasc1, its source coupled to the drain of gain transistor 854a, and its drain coupled to load circuit 890a Amplifier stage 850b includes a gain transistor 854b and a cascode transistor 856b, which are coupled in similar manner as gain transistor 854a and cascode transistor 856a Amplifier stages 850a and 850b may be independently selected via NMOS transistor 842a and 842b, respectively, and independently enabled or disabled via the Vcasc1 and Vcasc2 voltages, respectively.

FIG. 8A shows an exemplary design in which a signal path from the LNA input (node X) to each amplifier stage 850 includes NMOS transistor 842, attenuation circuit 860, and AC coupling capacitor 844. A signal path may also include fewer, different, and/or additional circuits. Furthermore, the signal path for amplifier stage 850a may or may not match the signal path for amplifier stage 850b. For example, NMOS transistor 842a may be omitted whereas NMOS transistor 842b may be retained. Attenuation circuits 860a and 860b for the two signal paths may be identical, or may have the same circuit design but different values, or may have different circuit designs with different circuit topologies.

NMOS transistor 842a operates as a switch that can pass the input RF signal to amplifier stage 850a when NMOS transistor 842a is enabled by the Enb1 signal. Similarly, NMOS transistor 842b operates as a switch that can pass the input RF signal to amplifier stage 850b in the CA mode when NMOS transistor 842b is enabled by the Enb2 signal. In one design, NMOS transistors 842a may be enabled in both the CA mode and the non-CA mode, and NMOS transistors 842b may be enabled only in the CA mode. Separate NMOS transistors 842a and 842b and separate attenuation circuits 860a and 860b may be used to allow the input RF signal to encounter only one series switch prior to hitting gain transistor 854a or 854b.

In the CA mode, both NMOS transistors 842a and 842b are turned On, and the input RF signal is provided to both attenuation circuits 860a and 860b and amplifier stages 850a and 850b. Each amplifier stage 850 amplifies the input RF signal and provides a respective output RF signal to its load circuit 890. In the non-CA mode, one amplifier stage 850a or 850b may be selected. NMOS transistor 842 for the selected amplifier stage 850 is turned On, and the input RF signal is provided to attenuation circuit 860 and the selected amplifier stage 850. NMOS transistor 842 for the unselected amplifier stage 850 is turned Off, and attenuation circuit 860 and the unselected amplifier stage 850 are disconnected from node X, thereby reducing loading on the signal path for the selected amplifier stage 850. The selected amplifier stage 850 amplifies the input RF signal and provides an output RF signal to the associated load circuit 890.

CA LNA 840a may be advantageously used in a scenario in which the input RF signal includes jammers, which are undesired signals of large amplitude and close in frequency to the desired signals. Input attenuation circuits 860a and 860b may be programmable (e.g., as shown in FIG. 8A) or may be fixed (not shown in FIG. 8A) and may serve a dual purpose of attenuating the jammers in the input RF signal and providing a good input impedance match for CA LNA 840a. Attenuation circuits 860a and 860b may be designed differently and/or may have different settings/values for the CA mode and the non-CA mode in order to obtain a good input impedance match in both modes.

For simplicity, FIG. 8A shows CA LNA 840a including two amplifier stages 850a and 850b for two sets of carriers. CA LNA 840a may include more than two amplifier stages for more than two sets of carriers.

Figure 8B:
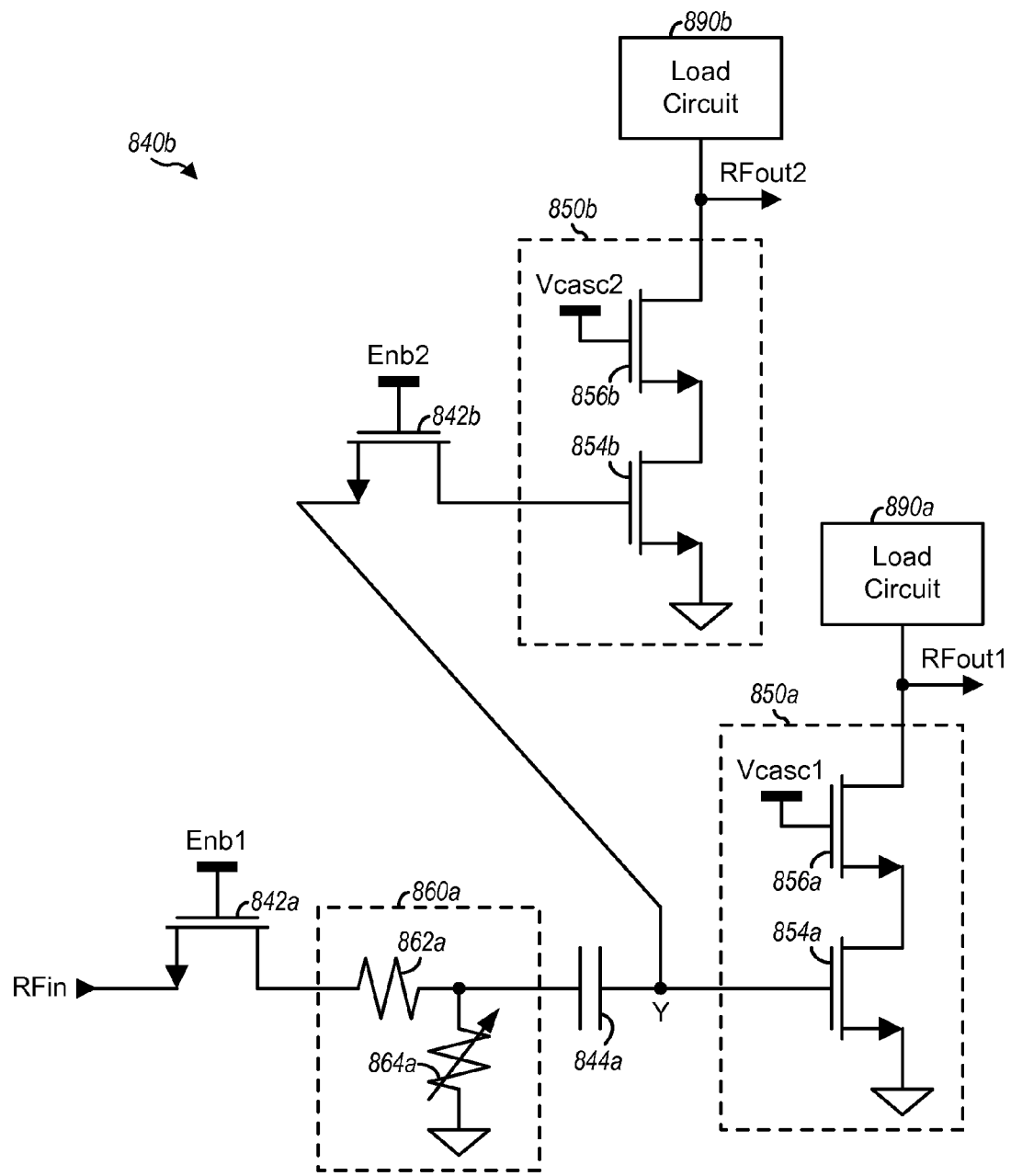
FIG. 8B shows an LNA with a shared input attenuation circuit for two amplifier stages.

FIG. 8B shows a schematic diagram of an exemplary design of a CA LNA 840b with a shared input attenuation circuit for both amplifier stages 850a and 850b. CA LNA 840b is yet another exemplary design of CA LNA 440 in FIG. 4A. CA LNA 840b includes two amplifier stages 850a and 850b coupled to a shared input attenuation circuit 860a and to two load circuits 890a and 890b. Sharing input attenuation circuit 860a between amplifier stages 850a and 850b may reduce circuit area and may also provide other advantages.

CA LNA 840b includes all of the circuit components in CA LNA 840a in FIG. 8A except for input attenuation circuit 860b and AC coupling capacitor 844b. All of the circuit components within CA LNA 840b are coupled as described above for CA LNA 840a in FIG. 8A except for NMOS transistor 842b. NMOS transistor 842b has its source coupled to the input of amplifier stage 850a, its gate receiving an Enb2 control signal, and its drain coupled to the input of amplifier stage 850b Amplifier stages 850a and 850b may be independently selected via NMOS transistor 842a and 842b, respectively, and may be independently enabled or disabled via the Vcasc1 and Vcasc2 voltages, respectively.

In the exemplary design shown in FIG. 8B, amplifier stages 850a and 850b share a common input switch implemented with NMOS transistor 842a and a common input attenuation circuit 860a. Input attenuation circuit 860a may be programmable (e.g., as shown in FIG. 8B) or may be fixed (not shown in FIG. 8B) and may serve a dual purpose of attenuating incoming jammers in the input RF signal and providing a good input impedance match for CA LNA 840b. Attenuation circuit 860a may have different settings for the CA mode and the non-CA mode in order to obtain a good input impedance match in both modes.

In the CA mode, both NMOS transistors 842a and 842b are turned On, and the input RF signal is provided via attenuation circuit 860a to both amplifier stages 850a and 850b. The input RF signal passes through a single series switch prior to hitting gain transistor 854a. The input RF signal passes through two series switches prior to hitting gain transistor 854b, which may result in a small degradation in performance of amplifier stage 850b. In the non-CA mode, NMOS transistor 842a is turned On, and the input RF signal is provided to attenuation circuit 860a and amplifier stage 850a. NMOS transistor 842b is turned Off, and amplifier stage 850b is disconnected from node Y, thereby reducing capacitive loading on the signal path for amplifier stage 850a. The input RF signal passes through a single series switch implemented with NMOS transistor 842a prior to hitting gain transistor 854a in the non-CA mode.

Figure 9:
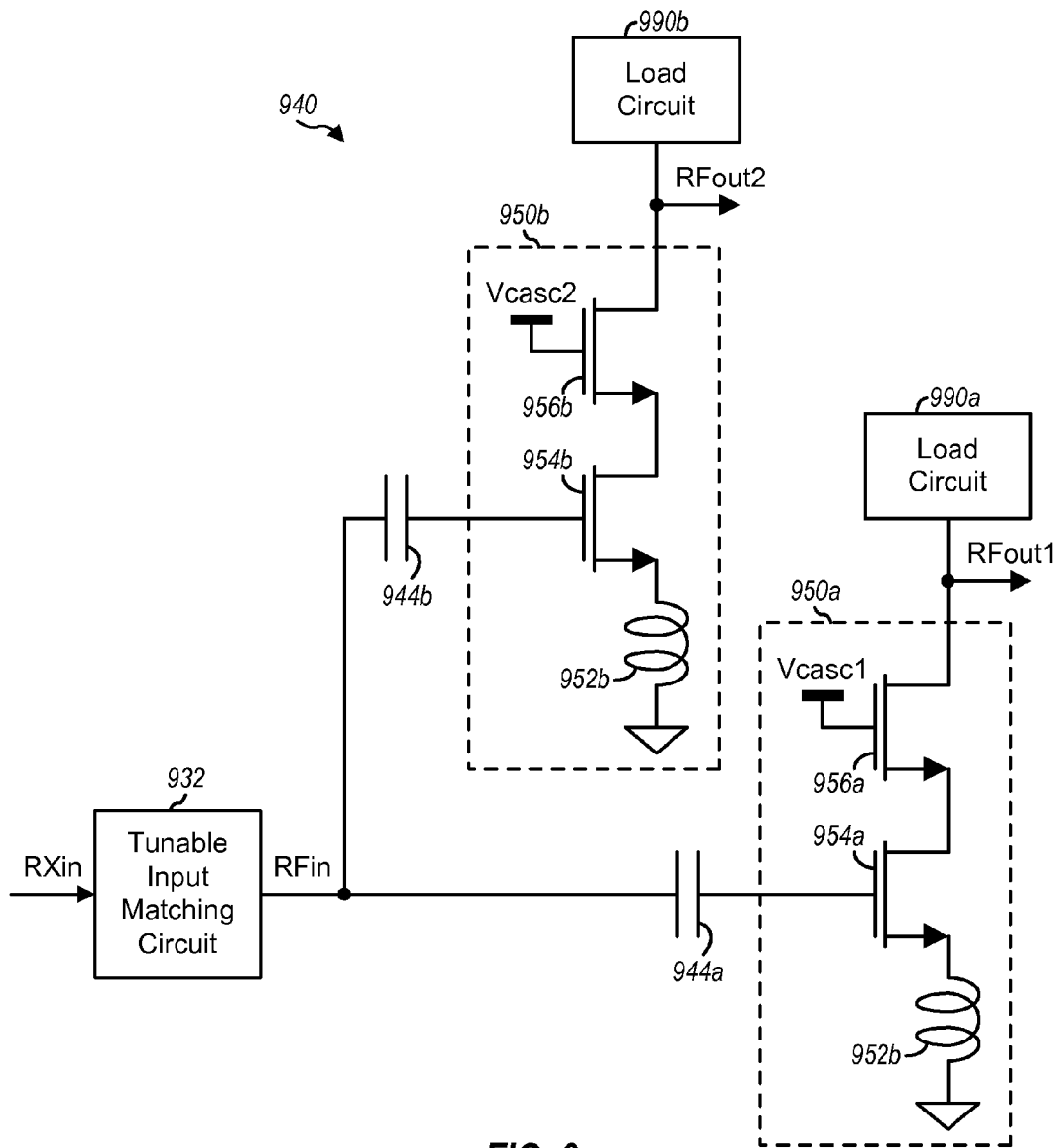
FIG. 9 shows an LNA with a tunable input matching circuit.

FIG. 9 shows a schematic diagram of an exemplary design of a CA LNA 940 with a tunable matching circuit. CA LNA 940 is another exemplary design of CA LNA 440 in FIG. 4A. CA LNA 940 includes two amplifier stages 950a and 950b coupled to a shared tunable matching circuit 932 and to two load circuits 990a and 990b. Amplifier stage 950a includes a source degeneration inductor 952a, a gain transistor 954a, and a cascode transistor 956a, which are coupled in similar manner as inductor 652a, gain transistor 654a, and cascode transistor 656a in FIG. 6A. Amplifier stage 950b includes a source degeneration inductor 952b, a gain transistor 954b, and a cascode transistor 956b, which are also coupled in similar manner as inductor 652a, gain transistor 654a, and cascode transistor 656a in FIG. 6A. Cascode transistor 956a has its gate receiving a first control voltage, Vcasc1. Cascode transistor 956b has its gate receiving a second control voltage, Vcasc2. Each amplifier stage 950 may be independently enabled or disabled based on its Vcasc control voltage. Amplifier stages 950a and 950b may be independently enabled or disabled via the Vcasc1 and Vcasc2 voltages, respectively.

Matching circuit 932 receives an input RF signal and performs input matching for CA LNA 940. An AC coupling capacitor 944a has one end coupled to the output of matching circuit 932 and the other end coupled to the gate of gain transistor 954a. An AC coupling capacitor 944b has one end coupled to the output of matching circuit 932 and the other end coupled to the gate of gain transistor 954b.

CA LNA 940 supports the CA mode and the non-CA mode. In the CA mode, both amplifier stages 950a and 950b are enabled with the Vcasc1 and Vcasc2 voltages applied to cascode transistors 956a and 956b, respectively. In the non-CA mode, only one of the two amplifier stages 950a and 950b is enabled, depending on the particular load circuit to which the input RF signal is to be routed. Matching circuit 932 may be adjusted based on the number of enabled amplifier stages and/or which amplifier stage(s) are enabled in order to obtain good noise/power match in both the CA modes and the non-CA mode.

MIMO LNA 540 in FIG. 5A may be implemented with various circuit architectures. Some exemplary designs of MIMO LNA 540 are described below. MIMO LNA 540 may also be implemented with transistors of various types. Some exemplary designs of MIMO LNA 540 using NMOS transistors are described below.

Figure 10:
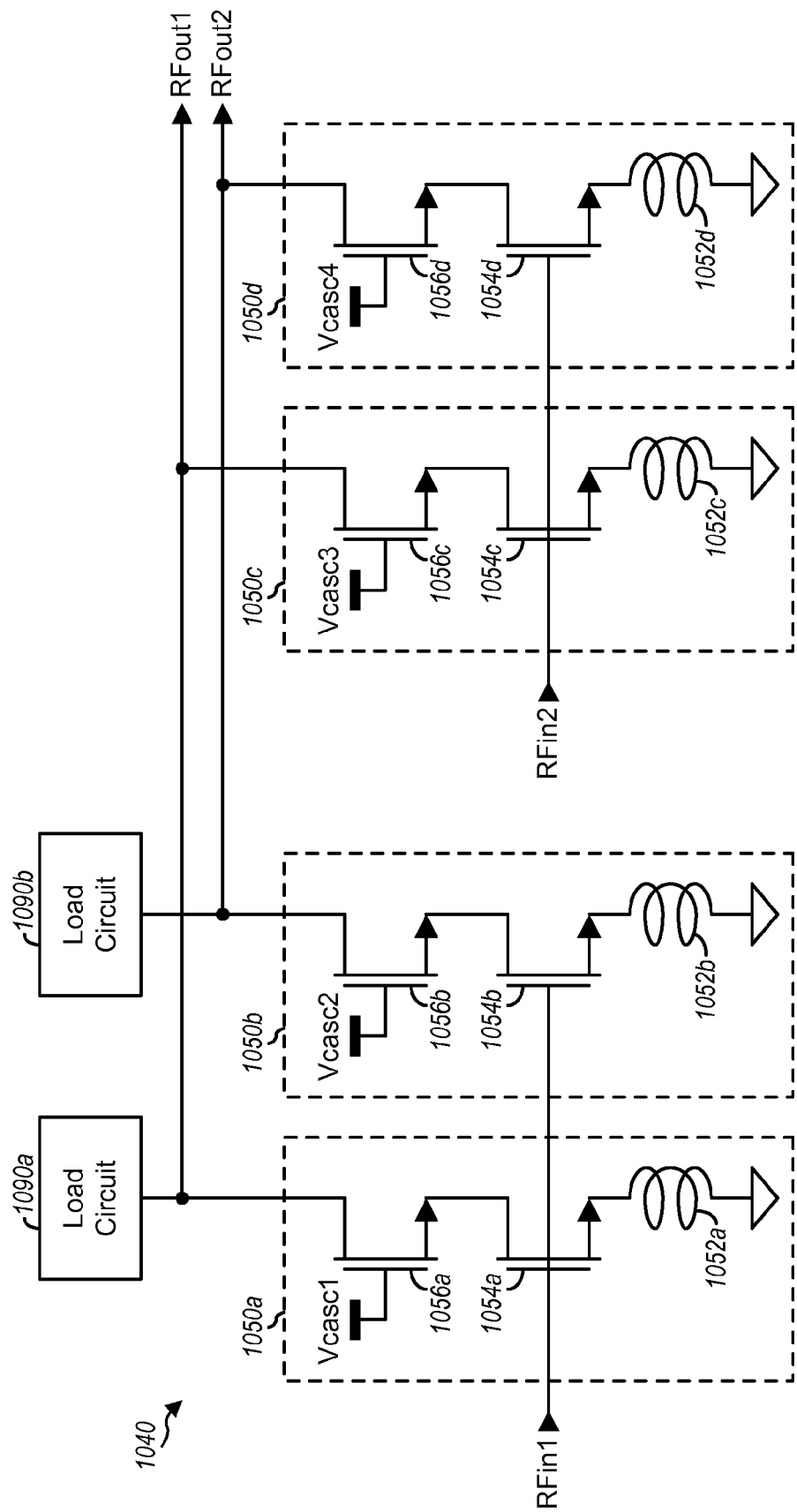
FIGS. 10 to 11C show several exemplary designs of a multiple-input multiple-output (MIMO) LNA.

FIG. 10 shows a schematic diagram of an exemplary design of a 2×2 MIMO LNA 1040 based on a cascode shutoff architecture. MIMO LNA 1040 is an exemplary design of MIMO LNA 540 in FIG. 5A and includes (i) two LNA inputs receiving two input RF signals, RFin1 and RFin2, and (ii) two LNA outputs providing two output RF signals, RFout1 and RFout2.

MIMO LNA 1040 includes four amplifier stages 1050a to 1050d coupled to two load circuits 1090a and 1090b. Each amplifier stage 1050a includes a source degeneration inductor 1052, a gain transistor 1054, and a cascode transistor 1056, which are coupled in similar manner as inductor 652a, gain transistor 654a, and cascode transistor 656a in FIG. 6A. Gain transistors 1054a and 1054b within amplifier stages 1050a and 1050b have their gates receiving the first input RF signal. Gain transistors 1054c and 1054d within amplifier stages 1050c and 1050d have their gates receiving the second input RF signal. Cascode transistors 1056a and 1056c within amplifier stages 1050a and 1050c have their drains coupled to load circuit 1090a and providing the first output RF signal. Cascode transistors 1056b and 1056d within amplifier stages 1050b and 1050d have their drains coupled to load circuit 1090b and providing the second output RF signal.

Amplifier stages 1050a and 1050b may be designed to provide good performance for a first set of one or more bands, e.g., as described above for CA LNA 640a in FIG. 6A. Similarly, amplifier stages 1050c and 1050d may be designed to provide good performance for a second set of one or more bands.

MIMO LNA 1040 may operate in a 1×2 configuration for intra-band CA. In the 1×2 configuration, an input RF signal, RFin1 or RFin2, may be provided via one LNA input to two gain transistors 1054 in two amplifier stages 1050. The input RF signal is amplified by the two gain transistors, buffered by the two cascode transistors coupled to the two gain transistors, and provided to load circuits 1090a and 1090b. MIMO LNA 1040 can support intra-band CA with the input RF signal provided to either of the two LNA inputs.

MIMO LNA 1040 may operate in a 2×2 configuration for inter-band CA. In the 2×2 configuration, a first input RF signal may be amplified by a first selected gain transistor 1054 in one amplifier stage 1050, buffered by cascode transistor 1056 coupled to the first selected gain transistor 1054, and provided to load circuit 1090a. A second input RF signal may be amplified by a second selected gain transistor 1054 in another amplifier stage 1050, buffered by cascode transistor 1056 coupled to the second selected gain transistor 1054, and provided to load circuit 1090b.

Figure 11A:
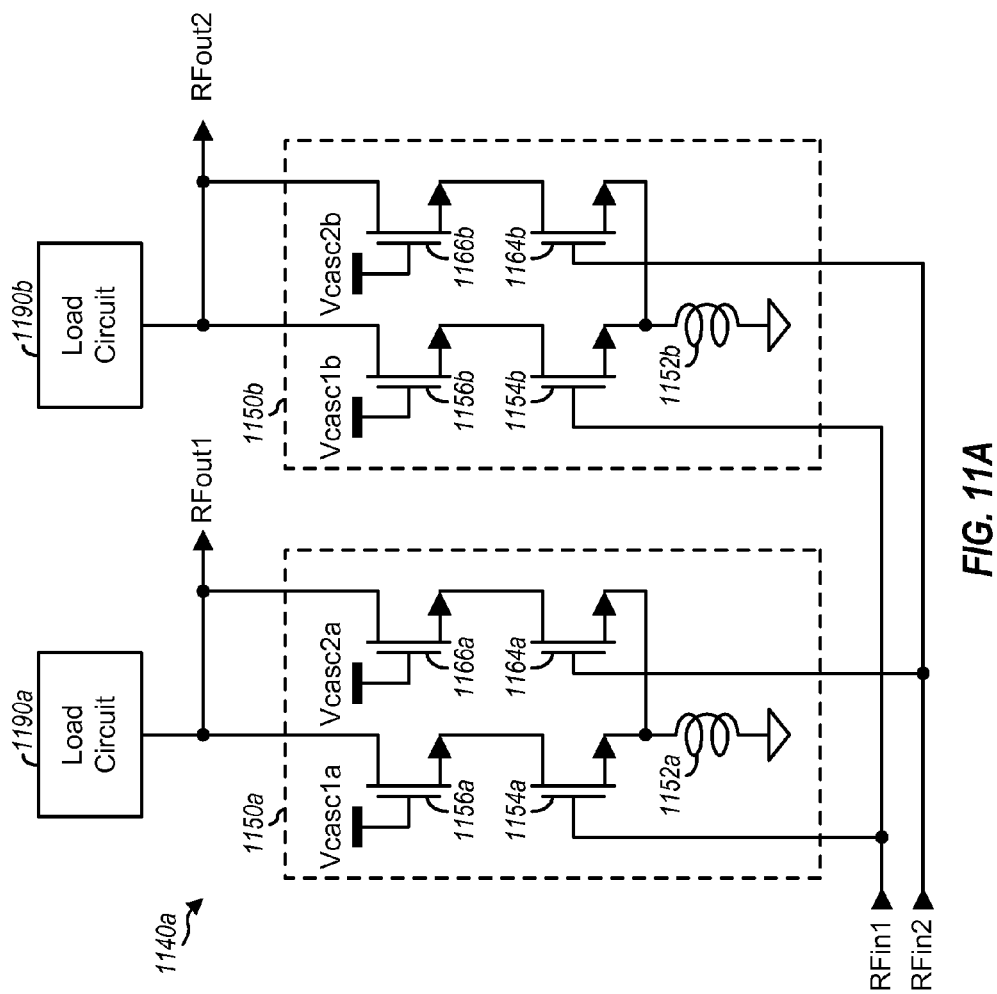

FIG. 11A shows a schematic diagram of an exemplary design of a 2×2 MIMO LNA 1140a based on the cascode shutoff architecture. MIMO LNA 1140a is another exemplary design of MIMO LNA 540 in FIG. 5A and includes (i) two LNA inputs receiving two input RF signals, RFin1 and RFin2, and (ii) two LNA outputs providing two output RF signals, RFout1 and RFout2.

MIMO LNA 1140a includes two amplifier stages 1150a and 1150b coupled to two load circuits 1190a and 1190b, respectively. Amplifier stage 1150a includes a source degeneration inductor 1152a, a gain transistor 1154a, and a cascode transistor 1156a, which are coupled in similar manner as inductor 652a, gain transistor 654a, and cascode transistor 656a in FIG. 6A. Gain transistor 1154a has its gate receiving the first input RF signal. Cascode transistor 1156a has its gate receiving a Vcasc 1a voltage and its drain coupled to load circuit 1190a. Amplifier stage 1150a further includes a gain transistor 1164a and a cascode transistor 1166a. Gain transistor 1164a has its source coupled to inductor 1152a and its gate receiving the second input RF signal. Cascode transistor 1166a has its gate receiving a Vcasc2a voltage and its drain coupled to load circuit 1190a.

Amplifier stage 1150b includes a source degeneration inductor 1152b, two gain transistors 1154b and 1164b, and two cascode transistors 1156b and 1166b, which are coupled in similar manner as inductor 1152a, gain transistors 1154a and 1164a, and cascode transistors 1156a and 1166a in amplifier stage 1150a. Gain transistors 1154b and 1164b have their gates receiving the first and second input RF signals, respectively. Cascode transistors 1156b and 1166b have their gates receiving Vcasc1b and Vcasc2b voltages, respectively, and their drains coupled to load circuit 1190b.

MIMO LNA 1140a may operate in a 1×2 configuration for intra-band CA. In the 1×2 configuration, an input RF signal, RFin1 or RFin2, may be provided via one LNA input to two gain transistors 1154a and 1154b (or to gain transistors 1164a and 1164b) in the two amplifier stages 1150a and 1150b. The input RF signal is amplified by the two gain transistors, buffered by the two cascode transistors coupled to the two gain transistors, and provided to load circuits 1190a and 1190b. MIMO LNA 1140a can support intra-band CA with the input RF signal applied to either of the two LNA inputs.

MIMO LNA 1140a may operate in a 2×2 configuration for inter-band CA. In the 2×2 configuration, a first input RF signal (e.g., RFin1) may be received by amplifier stage 1150a or 1150b and may be amplified by gain transistor 1154a or 1154b, buffered by cascode transistor 1156a or 1156b, and provided to load circuit 1190a or 1190b. A second input RF signal (e.g., RFin2) may be received by amplifier stage 1150a or 1150b, amplified by gain transistor 1164a or 1164b, buffered by cascode transistor 1166a or 1166b, and provided to load circuit 1190a or 1190b. Each amplifier stage 1150 would receive only one of the two input RF signals and would provide its output RF signal to load circuit 1190 coupled to that amplifier stage 1150.

Figure 11B:
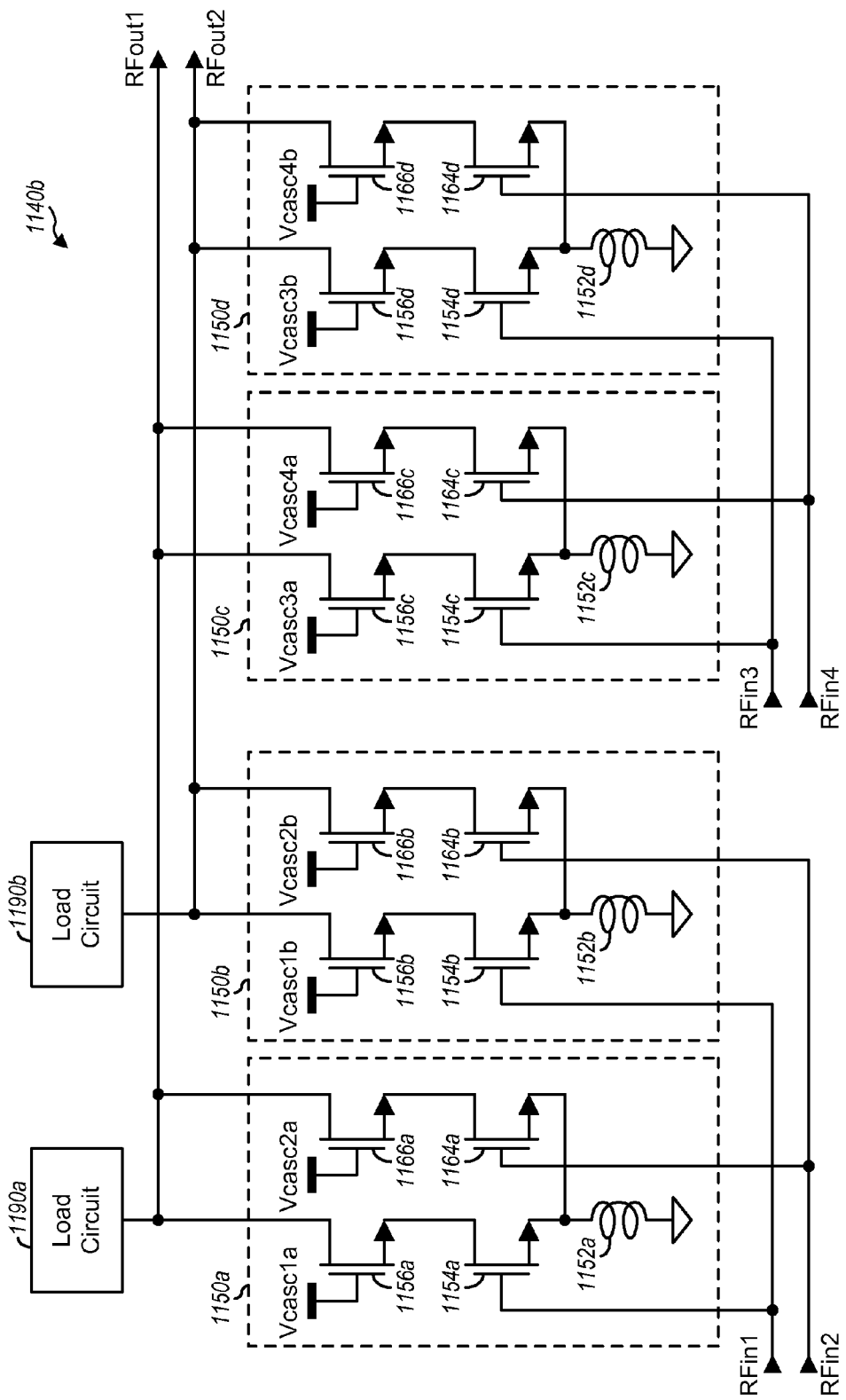

FIG. 11B shows a schematic diagram of an exemplary design of a 4×2 MIMO LNA 1140b based on the cascode shutoff architecture. MIMO LNA 1140b is yet another exemplary design of MIMO LNA 540 in FIG. 5A and includes (i) four LNA inputs receiving four input RF signals, RFin1 to RFin4, and (ii) two LNA outputs providing two output RF signals, RFout1 and RFout2. MIMO LNA 1140b includes four amplifier stages 1150a to 1150d coupled to two load circuits 1190a and 1190b. Amplifier stages 1150a and 1150b include source degeneration inductors, gain transistors, and cascode transistors that are coupled as described above for FIG. 11A.

Amplifier stage 1150c includes a source degeneration inductor 1152c, two gain transistors 1154c and 1164c, and two cascode transistors 1156c and 1166c, which are coupled in similar manner as inductor 1152a, gain transistors 1154a and 1164a, and cascode transistors 1156a and 1166a in amplifier stage 1150a. Gain transistors 1154c and 1164c have their gates receiving the third and fourth input RF signals, respectively. Cascode transistors 1156c and 1166c have their gates receiving Vcasc3a and Vcasc4a voltages, respectively, and their drains coupled to load circuit 1190a.

Amplifier stage 1150d includes a source degeneration inductor 1152d, two gain transistors 1154d and 1164d, and two cascode transistors 1156d and 1166d, which are coupled in similar manner as inductor 1152a, gain transistors 1154a and 1164a, and cascode transistors 1156a and 1166a in amplifier stage 1150a. Gain transistors 1154d and 1164d have their gates receiving the third and fourth input RF signals, respectively. Cascode transistors 1156d and 1166d have their gates receiving Vcasc3b and Vcas4b voltages, respectively, and their drains coupled to load circuit 1190b.

MIMO LNA 1140b may operate in a 1×2 configuration for intra-band CA. In the 1×2 configuration, an input RF signal (RFin1, RFin 2, RFin3 or RFin4) may be provided via one LNA input to two gain transistors in two amplifier stages 1150. The input RF signal is amplified by the two gain transistors, buffered by the two cascode transistors coupled to the two gain transistors, and provided to load circuits 1190a and 1190b. MIMO LNA 1140b can support intra-band CA with the input RF signal applied to any one of the four LNA inputs.

MIMO LNA 1140b may operate in a 2-input 2-output (2×2) configuration for inter-band CA. In the 2×2 configuration, a first input RF signal (e.g., RFin1 or RFin2) may be received by amplifier stage 1150a or 1150b, amplified by a first selected gain transistor in one amplifier stage 1150a or 1150b, buffered by the cascode transistor coupled to the first selected gain transistor, and provided to load circuit 1190a or 1190b. A second input RF signal (e.g., RFin3 or RFin4) may be received by amplifier stage 1150c or 1150d, amplified by a second selected gain transistor in amplifier stage 1150c or 1150d, buffered by the cascode transistor coupled to the second selected gain transistor, and provided to load circuit 1190a or 1190b. Only two amplifier stages 1150 are enabled to amplify the two input RF signals. Each enabled amplifier stage 1150 would receive only one of the two input RF signals and would provide its output RF signal to load circuit 1190 coupled to that amplifier stage 1150.

Figure 11C:
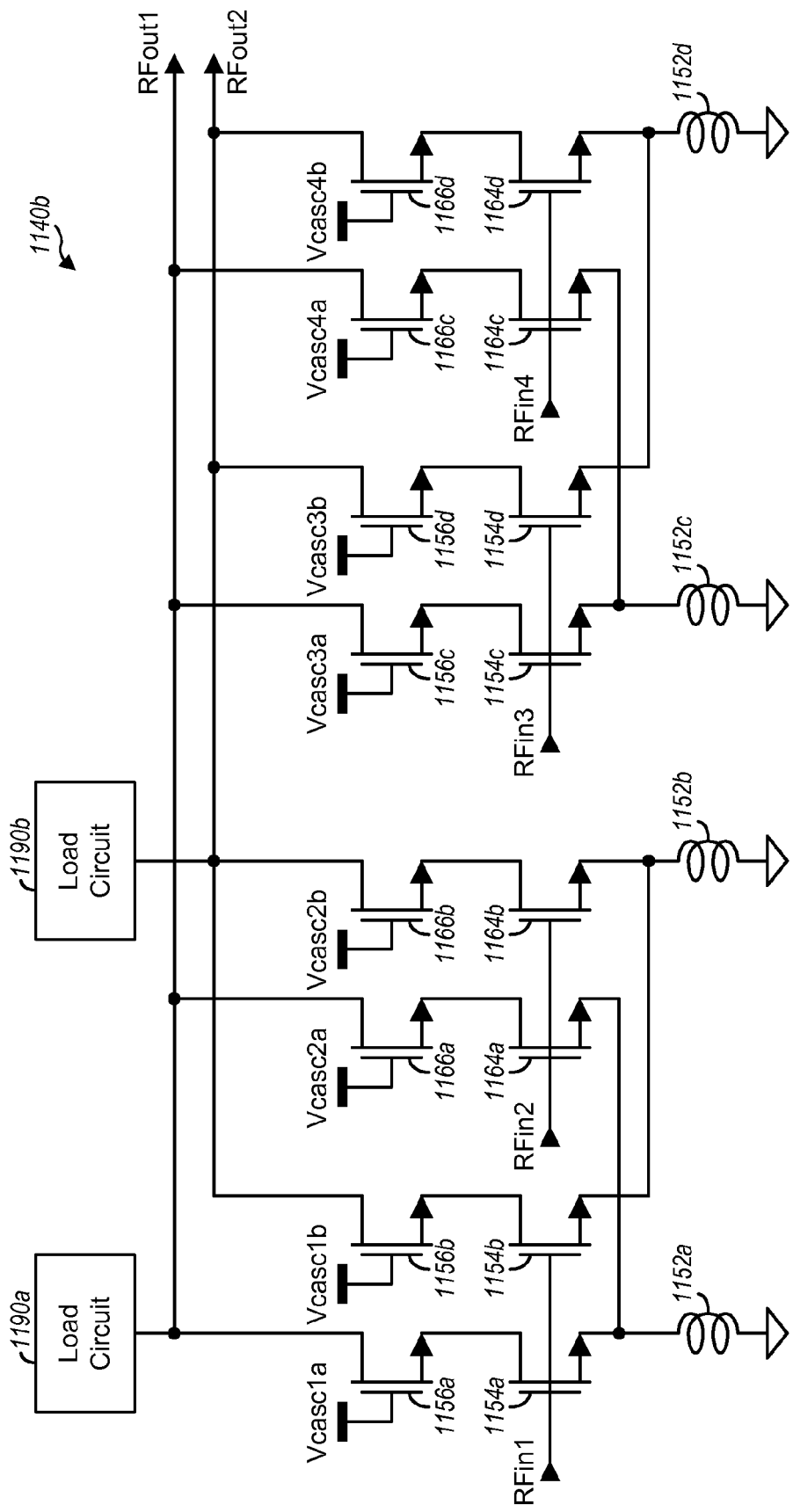

FIG. 11C shows a schematic diagram of another view of 4×2 MIMO LNA 1140b in FIG. 11B. MIMO LNA 1140b in FIG. 11C include all of the degeneration inductors, gain transistors, and cascode transistors shown in FIG. 11B, which are arranged differently in FIG. 11C. FIG. 11C shows that MIMO LNA 1140b can receive a single input RF signal provided to any LNA input (e.g., RFin1, RFin2, RFin3, or RFin4) and can provide two output RF signals to two load circuits 1190a and 1190b for intra-band CA. FIG. 11C also shows that MIMO LNA 1140b can receive two input RF signals provided to two LNA inputs (e.g., RFin1 and RFin3, or RFin1 and RFin4, or RFin2 and RFin3, or RFin2 and RFin4) and can provide two output RF signals to two load circuits 1190a and 1190b for inter-band CA. If a separate source degeneration inductor is used for each gain transistor (for a total of eight source degeneration inductors), then two input RF signals may be applied to any two LNA inputs.

FIGS. 10 and 11A show two exemplary designs of a 2×2 MIMO LNA. FIG. 11B shows an exemplary design of a 4×2 MIMO LNA. A MIMO LNA may also be implemented in other manners. For example, a MIMO LNA may include one or more feedback circuits, with each feedback circuit being coupled between the input and output of one or more amplifier stages, e.g., as shown in FIG. 7.

In general, a MIMO LNA with any number of inputs and any number of outputs may be implemented based on the cascode shutoff architecture. More LNA inputs for more bands may be supported with more amplifier stages and/or more gain and cascode transistors in each amplifier stage. More LNA outputs for more sets of carriers may also be supported with more amplifier stages and/or more gain and cascode transistors in each amplifier stage.

A matching circuit and a tunable matching circuit may be implemented in various manners. Some exemplary designs of a tunable matching circuit are described below.

FIG. 12A shows an exemplary design of a tunable matching circuit 1210 based on an L topology. The L topology includes a series circuit component coupled to a shunt circuit component. A series circuit component is a circuit component connected between two nodes. A shunt circuit component is a circuit component connected between a node and circuit ground. A circuit component may be an inductor, a capacitor, a resistor, etc. Matching circuit 1210 includes (i) a series inductor 1212 coupled between the input and output of matching circuit 1210 and (ii) a tunable shunt capacitor 1214 coupled between the output of matching circuit 1210 and circuit ground.

FIG. 12B shows an exemplary design of a tunable matching circuit 1220 based on the L topology. Matching circuit 1220 includes (i) a tunable series capacitor 1222 coupled between the input and output of matching circuit 1220 and (ii) a shunt inductor 1224 coupled between the output of matching circuit 1220 and circuit ground.

FIG. 12C shows an exemplary design of a tunable matching circuit 1230 based on an R topology. The R topology includes a shunt circuit component coupled to a series circuit component. Matching circuit 1230 includes (i) a tunable shunt capacitor 1232 coupled between the input of matching circuit 1230 and circuit ground and (ii) a series inductor 1234 coupled between the input and output of matching circuit 1230.

FIG. 12D shows an exemplary design of a tunable matching circuit 1240 based on a Pi topology. The Pi topology includes a shunt circuit component coupled to a series circuit component, which is coupled to another shunt circuit component. Matching circuit 1240 includes (i) a shunt capacitor 1242 coupled between the input of matching circuit 1240 and circuit ground, (ii) a series inductor 1244 coupled between the input and output of matching circuit 1240, and (iii) a tunable shunt capacitor 1246 coupled between the output of matching circuit 1240 and circuit ground.

FIG. 12E shows an exemplary design of a tunable matching circuit 1250 with two R sections. Matching circuit 1250 includes (i) a shunt inductor 1252 coupled between the input of matching circuit 1250 and a power supply, Vdd, (ii) a series capacitor 1254 coupled between the input of matching circuit 1250 and node E, (iii) a tunable shunt capacitor 1256 coupled between node E and circuit ground, and (iv) a series inductor 1258 coupled between node E and the output of matching circuit 1250.

FIG. 12F shows an exemplary design of a tunable matching circuit 1260 based on the Pi topology. Matching circuit 1260 includes (i) a shunt inductor 1262 coupled between the input of matching circuit 1260 and the Vdd supply, (ii) a series capacitor 1264 coupled between the input and output of matching circuit 1260, (iii) a tunable shunt capacitor 1266 coupled between the output of matching circuit 1260 and circuit ground, and (iv) a shunt inductor 1268 coupled between the output of matching circuit 1260 and circuit ground.

A fixed matching circuit may also be implemented based on any of the exemplary designs shown in FIGS. 12A to 12F. In this case, each adjustable circuit component (e.g., each adjustable capacitor) may be replaced with a fixed circuit component (e.g., a fixed capacitor).

In an exemplary design, an apparatus (e.g., a wireless device, an IC, a circuit module, etc.) may include first and second amplifier stages (e.g., for a CA LNA or a MIMO LNA). The first amplifier stage (e.g., amplifier stage 650a in FIG. 6A) may receive and amplify an input RF signal and provide a first output RF signal to a first load circuit (e.g., load circuit 690a) when the first amplifier stage is enabled. The input RF signal may comprise transmissions sent on multiple carriers at different frequencies to a wireless device. The second amplifier stage (e.g., amplifier stage 650b in FIG. 6A) may receive and amplify the input RF signal and provide a second output RF signal to a second load circuit (e.g., load circuit 690b) when the second amplifier stage is enabled. Each load circuit may comprise at least one mixer (e.g., as shown in FIG. 4B or 5B) and/or other circuits. The first output RF signal may be processed (e.g., downconverted) for transmissions on a first set of at least one carrier. The second output RF signal may be processed for transmissions on a second set of at least one carrier.

In an exemplary design, the first amplifier stage may comprise a first gain transistor (e.g., gain transistor 654a in FIG. 6A) coupled to a first cascode transistor (e.g., cascode transistor 656a). The second amplifier stage may comprise a second gain transistor (e.g., gain transistor 654b) coupled to a second cascode transistor (e.g., cascode transistor 656b). The input RF signal may be provided to both the first and second gain transistors. In an exemplary design, the first amplifier stage may further comprise a first inductor (e.g., inductor 652a) coupled to the first gain transistor. The second amplifier stage may further comprise a second inductor (e.g., inductor 652b) coupled to the second gain transistor. In another exemplary design, the first and second gain transistors may have their sources coupled to circuit ground (e.g., as shown in FIGS. 8A and 8B).

In an exemplary design, the first and second amplifier stages may (i) provide the first and second output RF signals in a first/CA mode and (ii) provide the first output RF signal but not the second output RF signal in a second/non-CA mode. The first and second cascode transistors may both be enabled in the first/CA mode. Only one of the first and second cascode transistors may be enabled in the second/non-CA mode. The first and second gain transistors may be applied the input RF signal in both the first/CA mode and the second/non-CA mode. One of the first and second gain transistors may operate in a saturation region and the other one of the first and second gain transistors may operate in a linear region in the second/non-CA mode. Each amplifier stage may be enabled or disabled by providing one or more appropriate voltages to one or more cascode transistors in the amplifier stage.

In an exemplary design, a feedback circuit (e.g., feedback circuit 660 in FIG. 7) may be coupled between an output and an input of at least one of the first and second amplifier stages. The feedback circuit may comprise a resistor, or a capacitor, or an active circuit such as a transistor, or some other circuit, or any combination thereof.

In an exemplary design, separate attenuation circuits may be used for the amplifier stages, e.g., as shown in FIG. 8A. A first attenuation circuit (e.g., attenuation circuit 860a in FIG. 8A) may be coupled to the first amplifier stage and may receive the input RF signal and provide a first attenuated input RF signal to the first amplifier stage. A second attenuation circuit (e.g., attenuation circuit 860b in FIG. 8A) may be coupled to the second amplifier stage and may receive the input RF signal and provide a second attenuated input RF signal to the first amplifier stage.

In another exemplary design, a shared/common attenuation circuit may be used for all amplifier stages, e.g., as shown in FIG. 8B. The share attenuation circuit (e.g., attenuation circuit 860a in FIG. 8B) may be coupled to the first and second amplifier stages and may receive the input RF signal and provide an attenuated input RF signal to both amplifier stages.

In an exemplary design, an input matching circuit may be used for the amplifier stages. The input matching circuit (e.g., input matching circuit 632 in FIG. 6A) may be coupled to the first and second amplifier stages and may receive a receiver input signal and provide the input RF signal. The input matching circuit may be fixed (e.g., as shown in FIG. 6A) and may comprise one or more fixed circuit components. Alternatively, the input matching circuit may be tunable (e.g., as shown in FIG. 9) and may comprise at least one adjustable circuit component.

In an exemplary design, the apparatus may further component third and fourth amplifier stages (e.g., amplifier stages 1050c and 1050d in FIG. 10 for a MIMO LNA). The third amplifier stage (e.g., amplifier stage 1050c) may receive and amplify a second input RF signal and provide the first output RF signal to the first load circuit when the third amplifier stage is enabled. The fourth amplifier stage (e.g., amplifier stage 1050d) may receive and amplify the second input RF signal and provide the second output RF signal to the second load circuit when the fourth amplifier stage is enabled.

In another exemplary design, the first amplifier stage (e.g., amplifier stage 1150a in FIG. 11A) may receive and amplify the input RF signal or a second input RF signal and may provide the first output RF signal to the first load circuit when the first amplifier stage is enabled. The second amplifier stage (e.g., amplifier stage 1150b) may receive and amplify the input RF signal or the second input RF signal and may provide the second output RF signal to the second load circuit when the second amplifier stage is enabled. The first amplifier stage may further comprise a third gain transistor (e.g., gain transistor 1164a) coupled to a third cascode transistor (e.g., cascode transistor 1166a). The second amplifier stage may further comprise a fourth gain transistor (e.g., gain transistor 1164b) coupled to a fourth cascode transistor (e.g., cascode transistor 1166b). The second input RF signal may be provided to both the third and fourth gain transistors.

In another exemplary design, the apparatus may further include third and fourth amplifier stages (e.g., amplifier stages 1150c and 1150d in FIG. 11B for a MIMO LNA). The third amplifier stage (e.g., amplifier stage 1150c) may receive and amplify a third input RF signal or a fourth input RF signal and may provide the first output RF signal to the first load circuit when the third amplifier stage is enabled. The fourth amplifier stage (e.g., amplifier stage 1150d) may receive and amplify the third input RF signal or the fourth input RF signal and may provide the second output RF signal to the second load circuit when the fourth amplifier stage is enabled.

Figure 13:
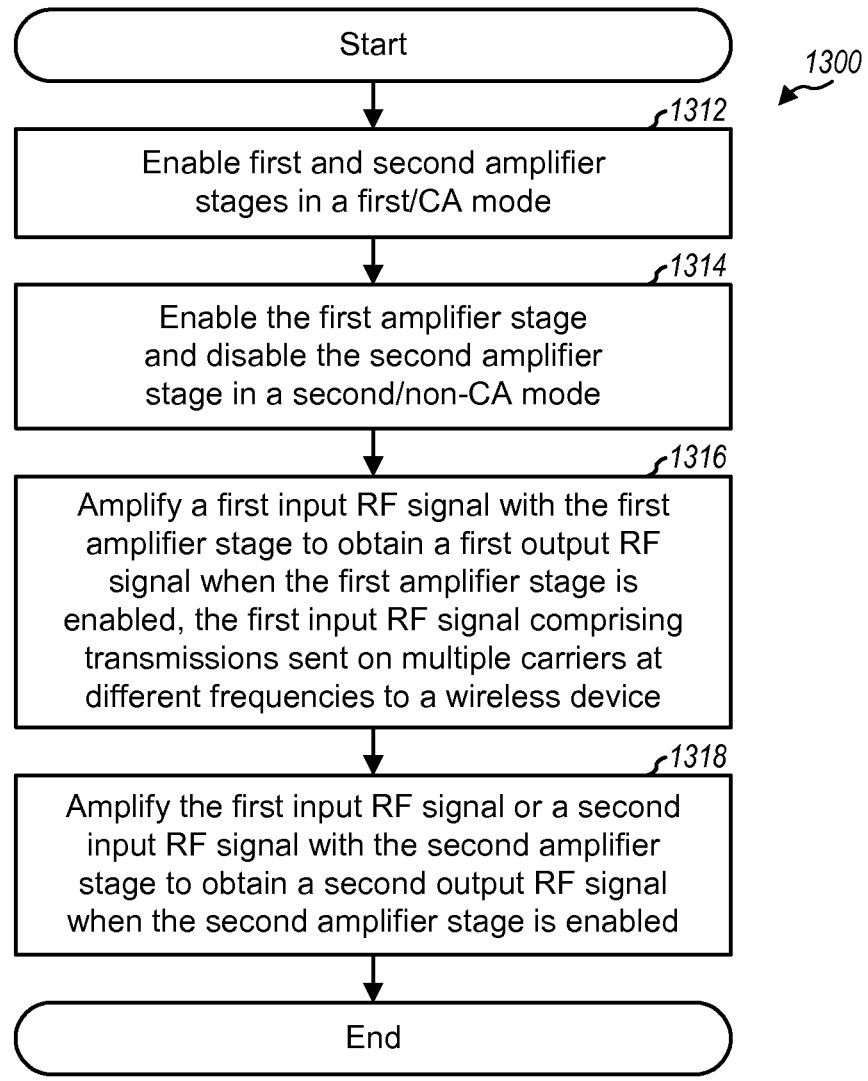
FIG. 13 shows a process for receiving signals in a wireless system.

FIG. 13 shows an exemplary design of a process 1300 for receiving signals in a wireless system. Process 1300 may be performed by a wireless device (as described below) or by some other entity. The wireless device may enable first and second amplifier stages in a first/CA mode (block 1312). The wireless device may enable the first amplifier stage and disable the second amplifier stage in a second/non-CA mode (block 1314). The wireless device may amplify a first input RF signal with the first amplifier stage to obtain a first output RF signal when the first amplifier stage is enabled (block 1316). The wireless device may amplify the first input RF signal or a second input RF signal with the second amplifier stage to obtain a second output RF signal when the second amplifier stage is enabled (block 1318). The first and second input RF signals may comprise transmissions sent on multiple carriers at different frequencies to the wireless device. The first and second input RF signals may be for different bands.

The LNAs described herein may be implemented on an IC, an analog IC, an RFIC, a mixed-signal IC, an ASIC, a printed circuit board (PCB), an electronic device, etc. The LNAs may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the LNAs described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
    a first amplifier stage configured to be independently enabled or disabled, the first amplifier stage further configured to receive and amplify an input radio frequency (RF) signal and provide a first output RF signal to a first load circuit when the first amplifier stage is enabled, the input RF signal employing carrier aggregation comprising transmissions sent on multiple carriers at different frequencies to a wireless device, the first output RF signal including at least a first carrier of the multiple carriers; and
    a second amplifier stage configured to be independently enabled or disabled, the second amplifier stage further configured to receive and amplify the input RF signal and provide a second output RF signal to a second load circuit when the second amplifier stage is enabled, the second output RF signal including at least a second carrier of the multiple carriers different than the first carrier.

2. The apparatus of claim 1, the first amplifier stage comprising a first gain transistor coupled to a first cascode transistor, the second amplifier stage comprising a second gain transistor coupled to a second cascode transistor, and the input RF signal being provided to both the first and second gain transistors.

3. The apparatus of claim 2, the first amplifier stage further comprising a first inductor coupled to the first gain transistor, and the second amplifier stage further comprising a second inductor coupled to the second gain transistor.

4. The apparatus of claim 2, the first and second gain transistors having sources coupled to circuit ground.

5. The apparatus of claim 2, the first and second amplifier stages providing the first and second output RF signals in a first mode and providing the first output RF signal but not the second output RF signal in a second mode, the first and second cascode transistors being enabled in the first mode, and only one of the first and second cascode transistors being enabled in the second mode.

6. The apparatus of claim 5, the first and second gain transistors being applied the input RF signal in both the first mode and the second mode, and one of the first and second gain transistors operating in a saturation region and the other one of the first and second gain transistors operating in a linear region in the second mode.

7. The apparatus of claim 1, further comprising:
a feedback circuit coupled between an output and an input of at least one of the first and second amplifier stages.

8. The apparatus of claim 7, the feedback circuit comprising a resistor, or a capacitor, or both a resistor and a capacitor.

9. The apparatus of claim 1, further comprising:
a first attenuation circuit coupled to the first amplifier stage and configured to receive the input RF signal; and
a second attenuation circuit coupled to the second amplifier stage and configured to receive the input RF signal.

10. The apparatus of claim 1, further comprising:
an attenuation circuit coupled to the first and second amplifier stages and configured to receive the input RF signal.

11. The apparatus of claim 1, further comprising:
an input matching circuit coupled to the first and second amplifier stages and configured to receive a receiver input signal and provide the input RF signal.

12. The apparatus of claim 11, the input matching circuit being tunable and comprising at least one adjustable circuit component.

13. The apparatus of claim 1, further comprising:
a third amplifier stage configured to receive and amplify a second input RF signal and provide the first output RF signal to the first load circuit when the third amplifier stage is enabled; and
a fourth amplifier stage configured to receive and amplify the second input RF signal and provide the second output RF signal to the second load circuit when the fourth amplifier stage is enabled.

14. The apparatus of claim 1,
the first amplifier stage configured to receive and amplify the input RF signal or a second input RF signal and provide the first output RF signal to the first load circuit when the first amplifier stage is enabled, and
the second amplifier stage configured to receive and amplify the input RF signal or the second input RF signal and provide the second output RF signal to the second load circuit when the second amplifier stage is enabled.

15. The apparatus of claim 2, the first amplifier stage further comprising a third gain transistor coupled to a third cascode transistor, the second amplifier stage further comprising a fourth gain transistor coupled to a fourth cascode transistor, and a second input RF signal being provided to both the third and fourth gain transistors.

16. The apparatus of claim 14, further comprising:
a third amplifier stage configured to receive and amplify a third input RF signal or a fourth input RF signal and provide the first output RF signal to the first load circuit when the third amplifier stage is enabled; and
a fourth amplifier stage configured to receive and amplify the third input RF signal or the fourth input RF signal and provide the second output RF signal to the second load circuit when the fourth amplifier stage is enabled.

17. A method comprising:
amplifying a first input radio frequency (RF) signal with a first amplifier stage to obtain a first output RF signal when the first amplifier stage is enabled, the first amplifier stage configured to be independently enabled or disabled, the first input RF signal employing carrier aggregation comprising transmissions sent on multiple carriers at different frequencies to a wireless device, the first output RF signal including at least a first carrier of the multiple carriers; and
amplifying the first input RF signal or a second input RF signal with a second amplifier stage to obtain a second output RF signal when the second amplifier stage is enabled, the second amplifier stage configured to be independently enabled or disabled, the second output RF signal including at least a second carrier of the multiple carriers different than the first carrier.

18. The method of claim 17, further comprising:
enabling the first and second amplifier stages in a first mode to obtain the first and second output RF signals; and
enabling the first amplifier stage and disabling the second amplifier stage in a second mode to obtain the first output RF signal but not the second output RF signal.

19. An apparatus comprising:
first means for amplifying configured to amplify a first input radio frequency (RF) signal and provide a first output RF signal when the first means for amplifying is enabled, the first means for amplifying configured to be independently enabled or disabled, the first input RF signal employing carrier aggregation comprising transmissions sent on multiple carriers at different frequencies to a wireless device, the second output RF signal including at least a second carrier of the multiple carriers different than the first carrier; and
second means for amplifying configured to amplify the first input RF signal or a second input RF signal and provide a second output RF signal when the second means for amplifying is enabled, the second means for amplifying configured to be independently enabled or disabled, the second output RF signal including at least a second carrier of the multiple carriers different than the first carrier.

20. The apparatus of claim 19, further comprising:
means for enabling the first and second means for amplifying in a first mode to obtain the first and second output RF signals; and
means for enabling the first means for amplifying and disabling the second means for amplifying in a second mode to obtain the first output RF signal but not the second output RF signal.

* * * * *